United States Patent
Kato et al.

(10) Patent No.: US 11,300,609 B2
(45) Date of Patent: Apr. 12, 2022

(54) ELECTRONIC COMPONENT PRESSING APPARATUS AND ELECTRONIC COMPONENT TESTING APPARATUS

(71) Applicant: ADVANTEST Corporation, Tokyo (JP)

(72) Inventors: Yasuyuki Kato, Tokyo (JP); Natsuki Shiota, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/018,456

(22) Filed: Sep. 11, 2020

(65) Prior Publication Data

US 2022/0082613 A1    Mar. 17, 2022

(51) Int. Cl.
*G01R 31/28* (2006.01)

(52) U.S. Cl.
CPC ..... *G01R 31/2867* (2013.01); *G01R 31/2863* (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| | | | |
|---|---|---|---|
| 2007/0013404 A1* | 1/2007 | Yoon | G01R 31/2893 324/750.05 |
| 2009/0153158 A1* | 6/2009 | Dunn | G01R 31/2822 324/762.01 |
| 2009/0153175 A1 | 6/2009 | Kaneko | |

FOREIGN PATENT DOCUMENTS

JP   WO2007055004 A1   4/2009

* cited by examiner

*Primary Examiner* — Tung X Nguyen
(74) *Attorney, Agent, or Firm* — Osha Bergman Watanabe & Burton LLP

(57) ABSTRACT

An electronic component presser is included in an electronic component testing apparatus used to test a device under test (DUT). The electronic component testing apparatus includes an electronic component handler, an electronic component tester, and a first socket. The electronic component presser connects to the electronic component handler and to the electronic component tester. The electronic component presser includes: a holding plate that holds the DUT that has been carried to the holding plate by a contact arm of the electronic component handler; a transport unit that moves the DUT between the holding plate and the first socket; a pusher that presses the DUT that has been disposed on the first socket; and an antenna unit comprising a measurement antenna that faces a device antenna of the DUT disposed on the first socket.

11 Claims, 29 Drawing Sheets

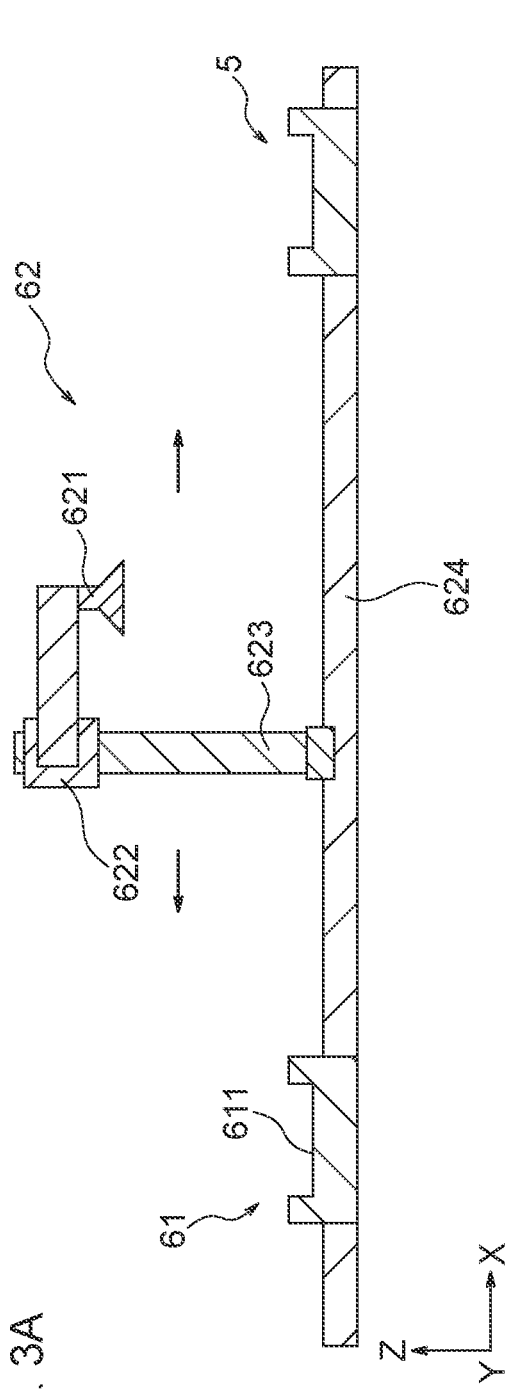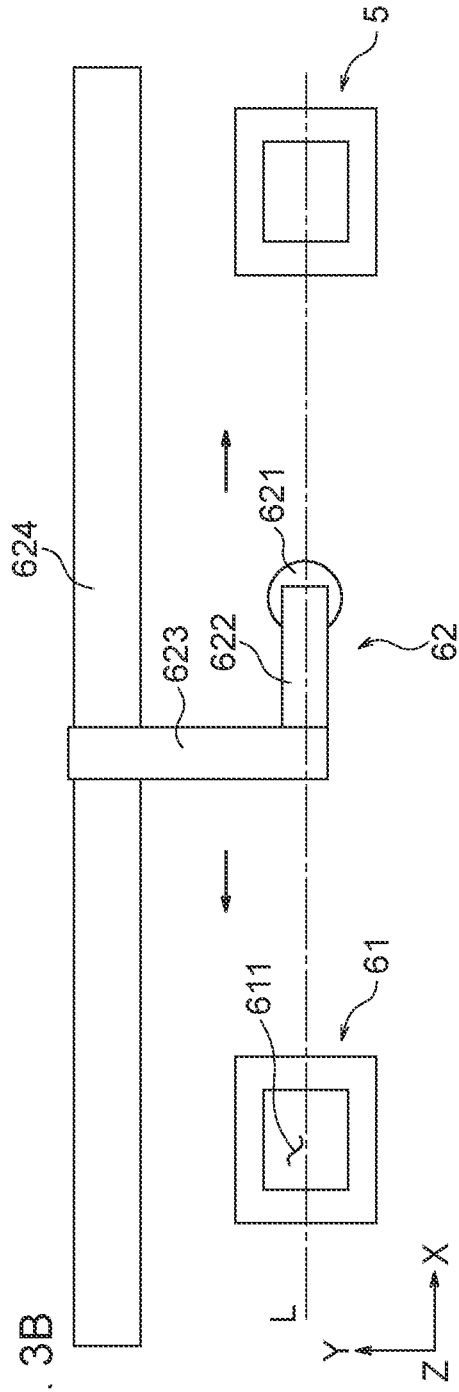

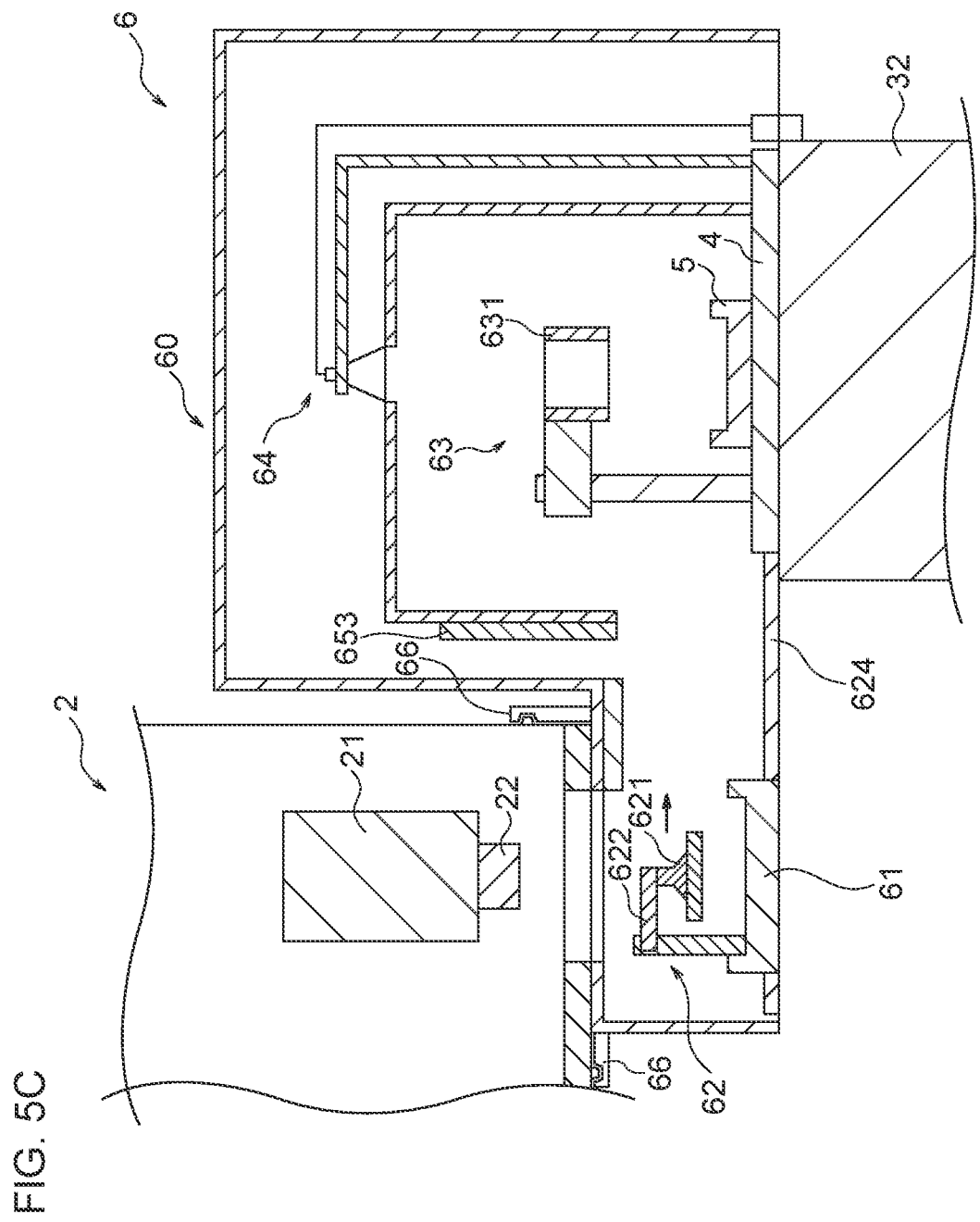

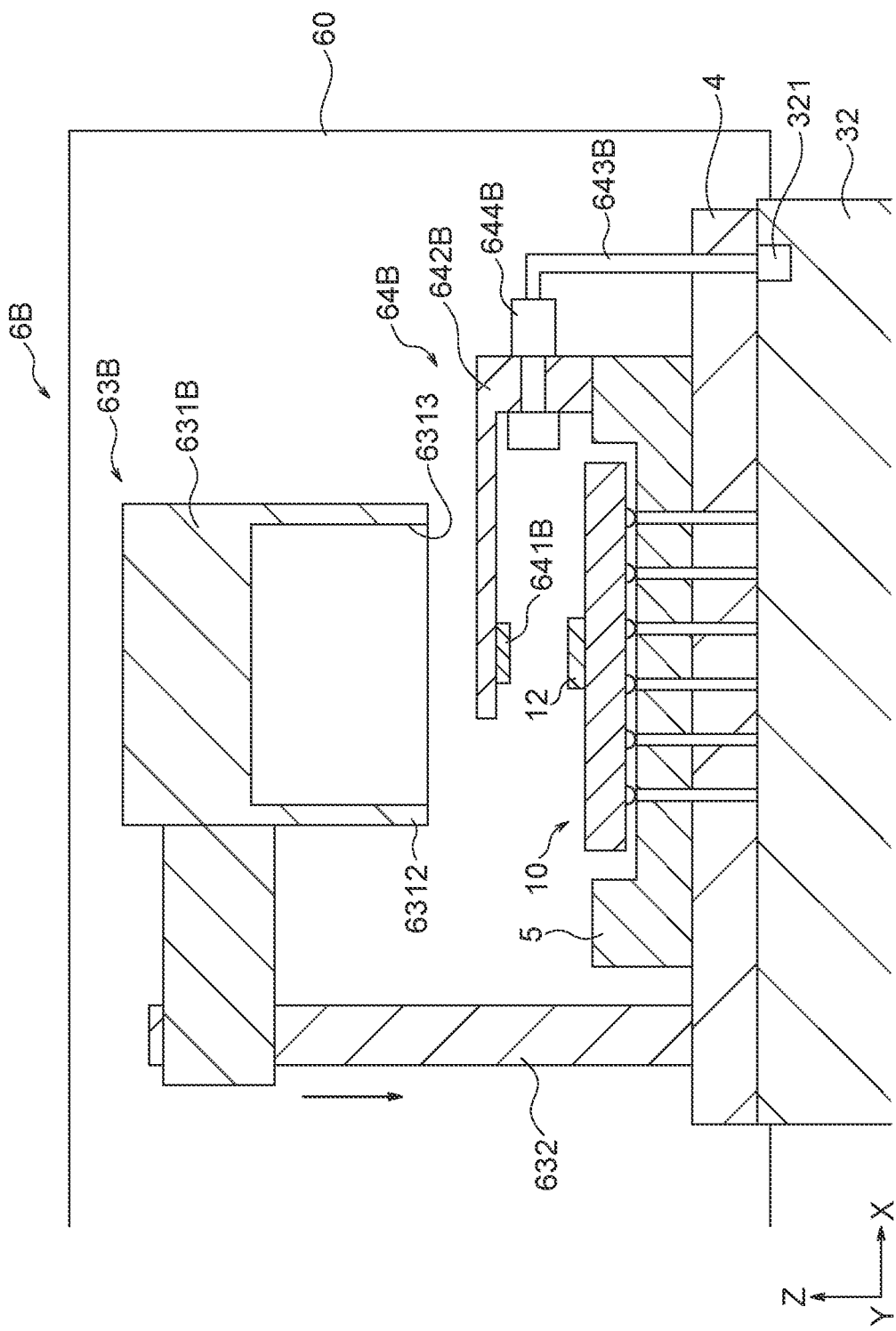

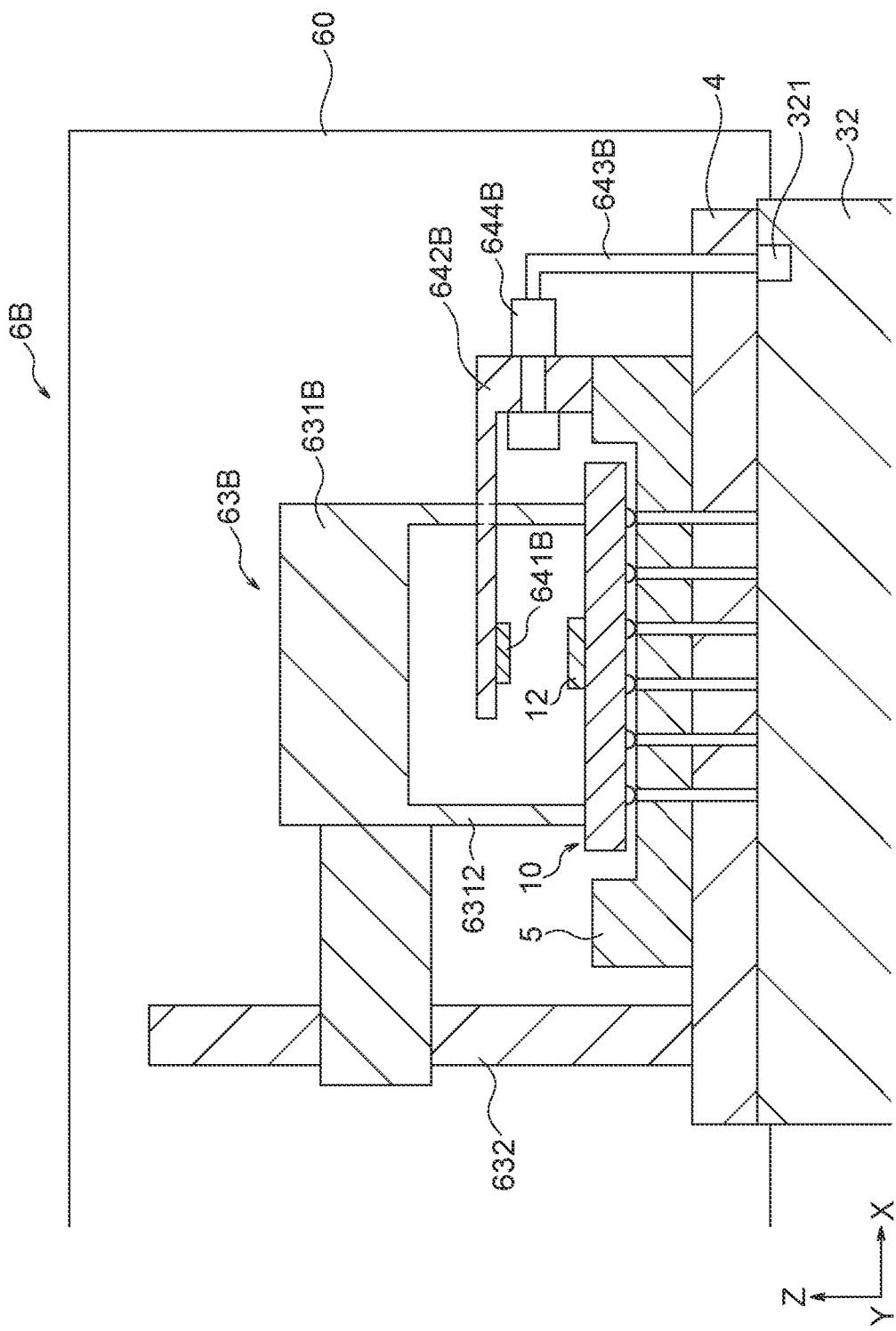

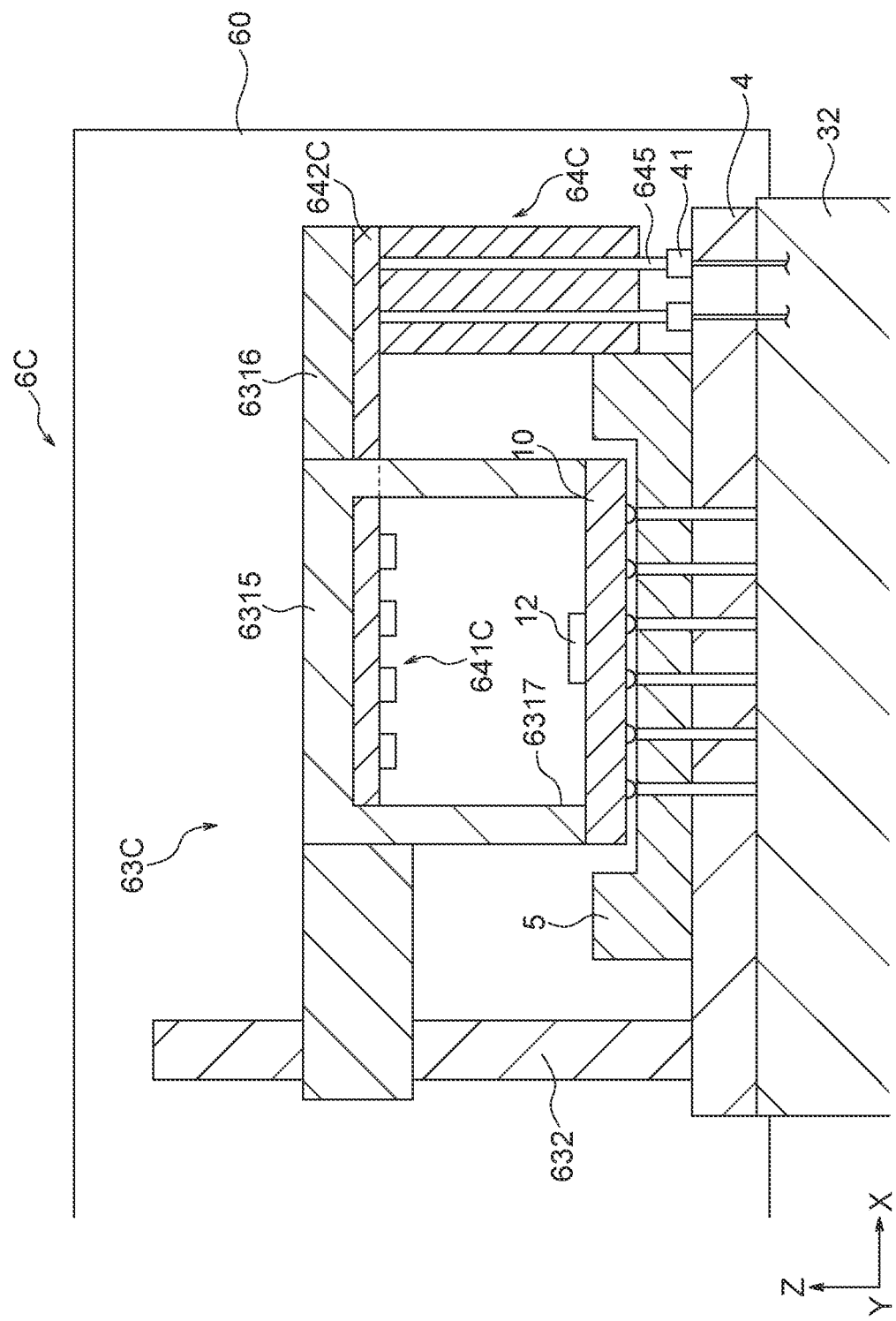

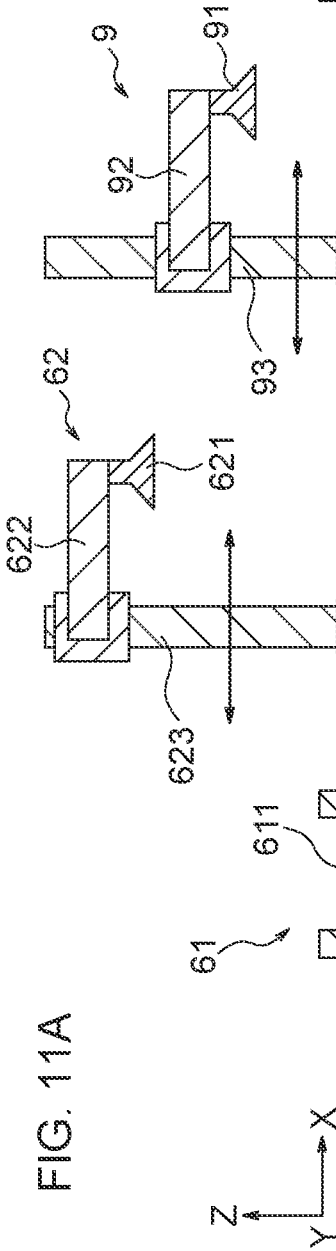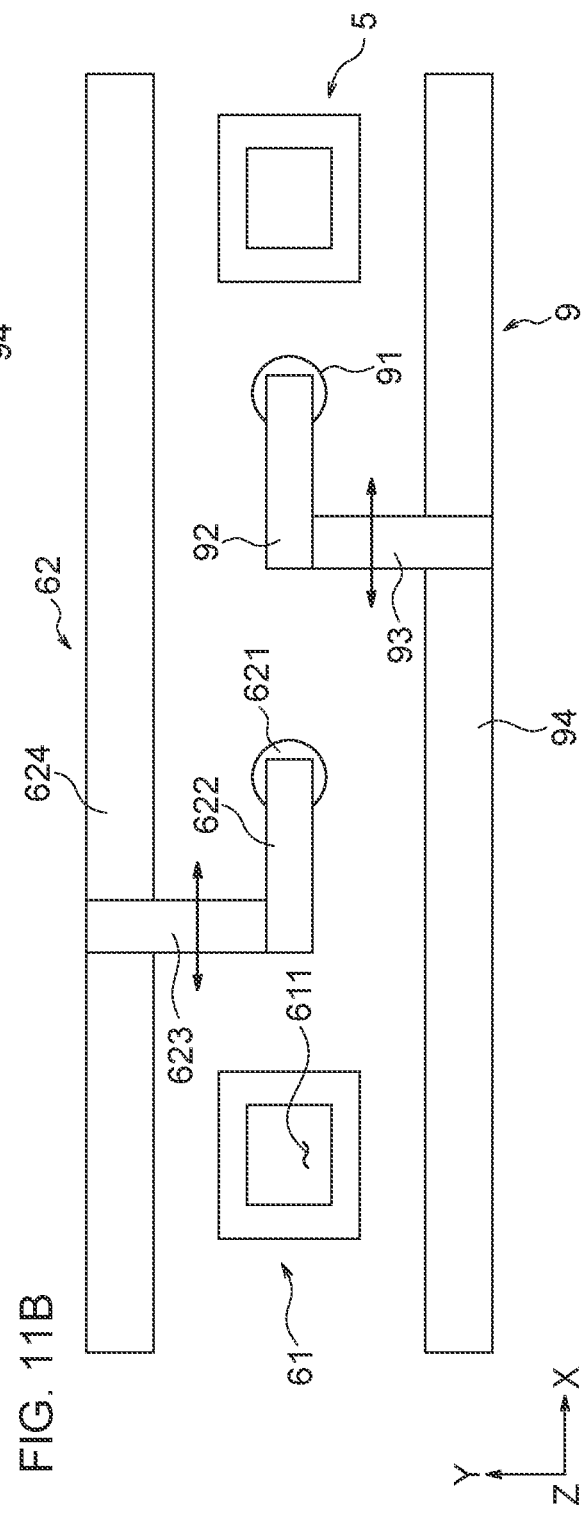

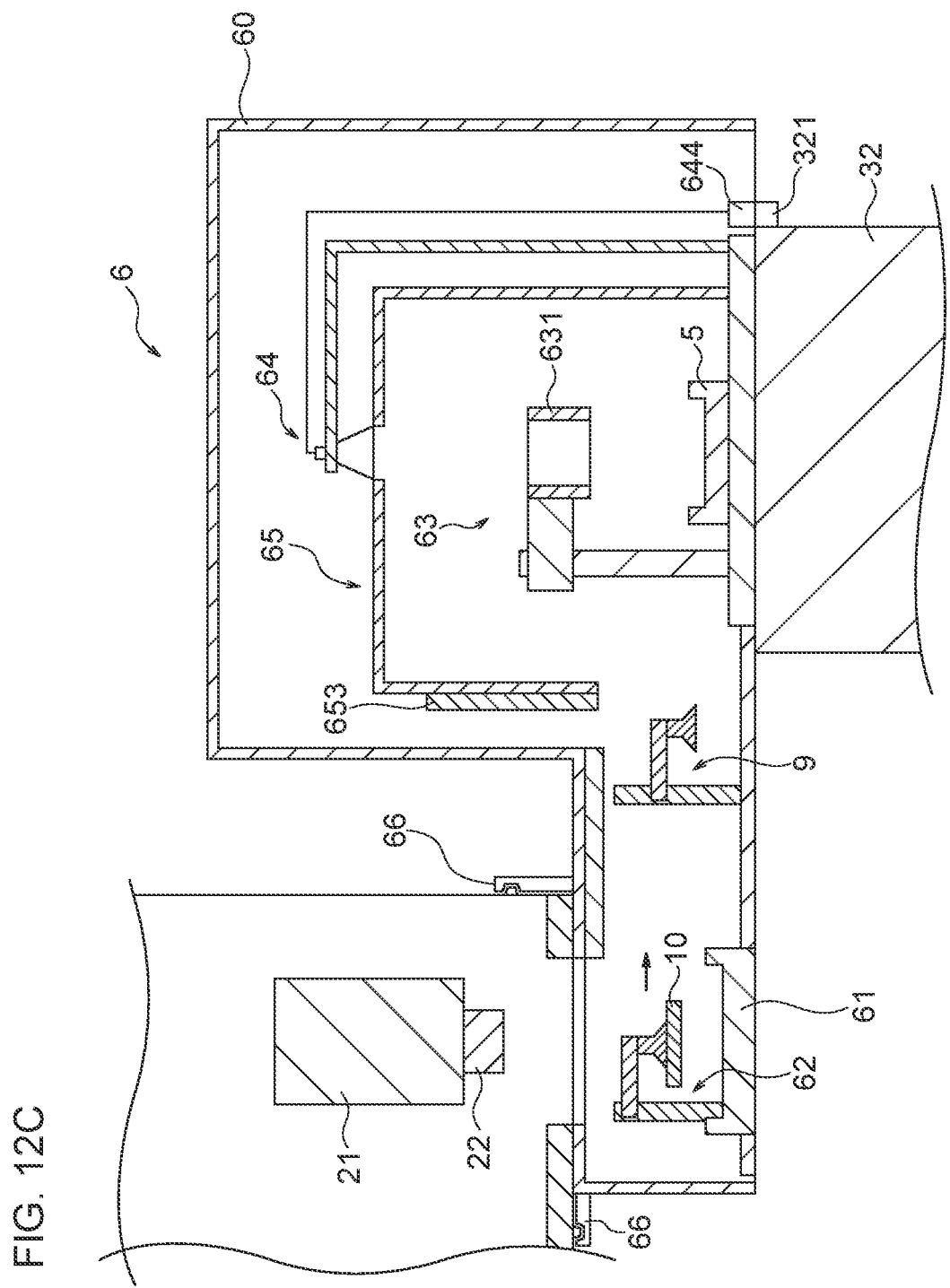

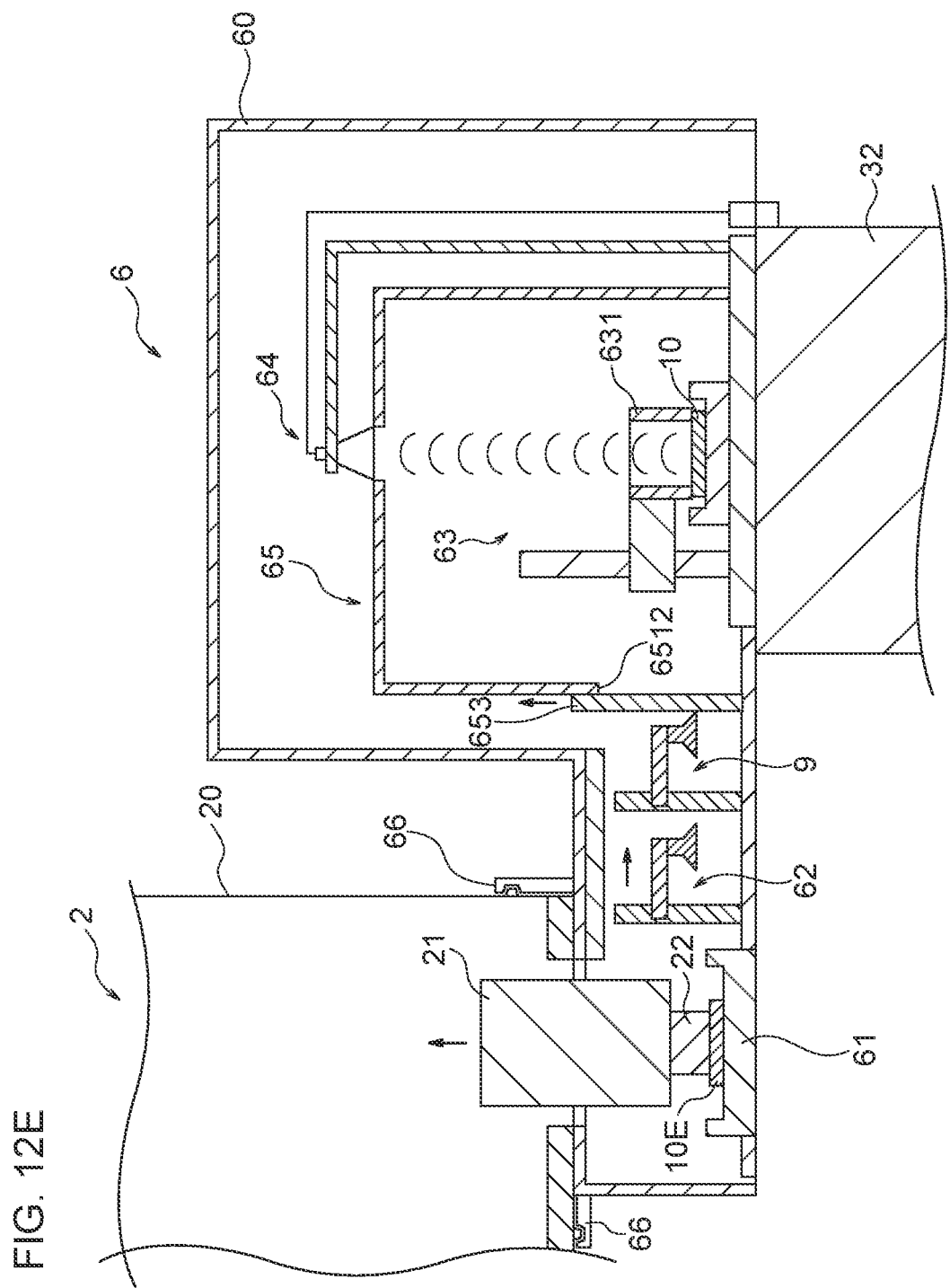

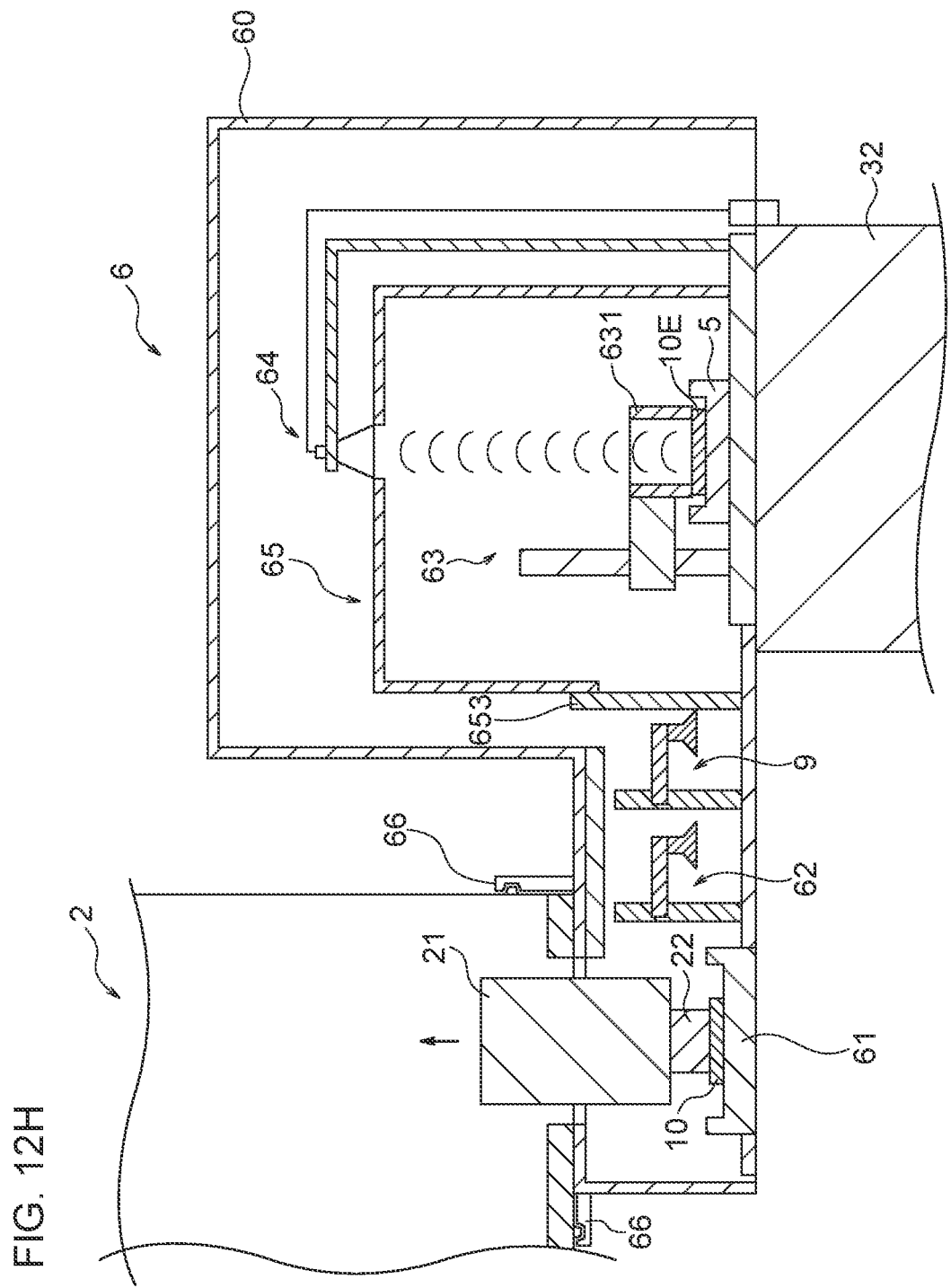

ELECTRONIC COMPONENT PRESSING APPARATUS AND ELECTRONIC COMPONENT TESTING APPARATUS

TECHNICAL FIELD

The present invention relates to an electronic component pressing apparatus (or presser) used for testing an electronic component having an antenna (DUT: Device Under Test), and an electronic component testing apparatus having the electronic component pressing apparatus.

BACKGROUND ART

An electronic component testing apparatus testing the DUT while pressing the DUT against a socket by a contact arm of an electronic component handling apparatus has been known, for example, Patent Document 1.

CITATION LIST

Patent Document 1: Re-Publication 2007/055004

Over the Air (OTA) test to determine a radio wave radiation characteristic of the DUT having an antenna on the top surface of the device commonly needs to arrange a measurement antenna above the DUT. However, the testing apparatus described above needs a drastic change of the design since the space above the DUT, in the test, is filled by the contact arm of the electronic component handling apparatus. This may increase the cost of the electric component handling apparatus or the cost of the test for the radio wave radiation characteristic of the DUT.

SUMMARY

One or more embodiments of the present invention provide an electronic component pressing apparatus that enables the cost reduction of the test of DUT having an antenna on the upper surface of the device, and provide an electronic component testing apparatus having the electronic component pressing apparatus.

[1] One or more embodiments of present invention provide an electronic component pressing apparatus used for testing a DUT having a device antenna. The electronic component pressing apparatus is connectable to the electronic component handling apparatus (or handler) having a contact arm and is to be connected to a test head on which a first socket is mounted. The electronic component pressing apparatus includes a holding plate on which the DUT carried by the contact arm is to be set, a transport unit to move the DUT between the holding plate and the first socket, and an antenna unit having a measurement antenna opposed to (i.e., that faces) the device antenna of the DUT set on the first socket.

[2] In one or more embodiments of the present invention, the electronic component pressing apparatus may include a drive unit to move the pusher in the vertical direction.

[3] In one or more embodiments of the present invention, the electronic component pressing apparatus may include a first case storing the holding plate, the transport unit, the pusher, and the antenna unit. The first case may include a first opening, which the contact arm passes through and is at a position facing the holding plate, and a second opening arranged at a position facing the pusher. The first socket may be positioned in the first case through the second opening.

[4] In one or more embodiments of the present invention, the electronic component pressing apparatus may include a fixing member to fix the first case to the handler in a state in which a third opening in the handler through which the contact arm passes and the first opening face each other.

[5] In one or more embodiments of the present invention, the electronic component pressing apparatus may include a shutter which is to close the first opening.

[6] In one or more embodiments of the present invention, the electronic component pressing apparatus may include a lifting unit which moves the holding plate in the vertical direction.

[7] In one or more embodiments of the present invention, the relative positional relationship between the measurement antenna and the first socket may be fixed. The pusher may have a third opening facing the measurement antenna. The measurement antenna may face the first socket through the fourth opening, which is located on the opposite side of the pusher from the first socket.

[8] In one or more embodiments of the present invention, the electronic component pressing apparatus may include a second case storing the pusher and a radio wave absorber on an inner wall of the second case. The first socket may be located in the second case.

[9] In one or more embodiments of the present invention, the relative positional relationship between the measuring antenna and the first socket may be fixed. The pusher may include a cylindrical contact portion which contacts the DUT set on the socket. The antenna unit may include a support which supports the measurement antenna and a first connector which is connected to the measurement antenna. The contact portion may include a fifth opening facing the first socket and a notch which the support can penetrate on the side of the contact portion. The measurement antenna may be in the fourth opening when the contact portion contacts the DUT. The first connector may be connected to a second connector of the test head.

[10] In one or more embodiments of the present invention, the pusher may include a sixth opening facing the first socket, which is cylindrical. The measurement antenna may be disposed inside the pusher to face the first socket through the sixth opening and be to move relative to the first socket in accordance with movement of the pusher. The antenna unit may include a support which supports the measurement antenna and a first connector connected to the measurement antenna to transmit a radio wave or an electrical signal. The first connector may be connected to a second connector connected to the test head in accordance with pressing of the DUT against the first socket by the pusher.

[11] One or more embodiments of the present invention provide an electronic component testing apparatus for testing a DUT having a device antenna. The electronic component testing apparatus includes the electronic component pressing apparatus described above, an electronic component handling apparatus having a contact arm, and a tester having a test head on which a first socket is mounted. The tester tests the DUT by transmitting and receiving radio waves between the device antenna and the measurement antenna in a state in which the DUT and the first socket are electrically connected and the measurement antenna is electrically connected to the tester.

[12] One or more embodiments of the present invention provide an electronic component testing apparatus for testing a DUT having a device antenna. The electronic component testing apparatus includes an electronic component pressing apparatus described above, an electronic component handling apparatus having a contact arm, and a tester having a test head on which a first socket is mounted. The measurement antenna is electrically connected to the tester and disposed inside the first socket to face the device antenna of the DUT mounted on the first socket. The electronic component testing apparatus includes a second socket mounted on a side of the pusher facing the first socket. The second socket is connectable to the first socket in accordance with the pressing of the DUT against the first socket by the pusher. The tester tests the DUT by transmitting and receiving radio waves between the device antenna and the measurement antenna in a state in which the DUT and the second socket are electrically connected to each other and the second socket is electrically connected to the test head via the first socket.

An electronic component pressing apparatus according to the present invention receives the DUT from the electronic component handling apparatus, moves the DUT to the socket connected to the tester. Such electronic component pressing apparatus enables to use the existing electronic component handling apparatus for the radio wave emission property test of the DUT having an antenna on the upper surface of the device, eliminates to change the design of the handling apparatus. This allows to reduce the cost of testing a DUT including an antenna.

BRIEF DESCRIPTION OF DRAWINGS

FIG. 3A is an enlarged view corresponding to part III of FIG. 1, and FIG. 3B is a plan view corresponding to FIG. 3A.

FIG. 5C is a cross-sectional view (part 3) showing an operation of the electronic component testing apparatus according to the first embodiment for testing the DUT.

FIG. 7A is an enlarged view (part 1) corresponding to part II of FIG. 1 according to the second embodiment of the present invention.

FIG. 7B is an enlarged view (part 2) corresponding to part II of FIG. 1 according to the second embodiment of the present invention.

FIG. 8B is an enlarged view (part 2) corresponding to part II of FIG. 1 according to the third embodiment of the present invention.

FIG. 11A is a view showing a modification of the transport unit according to one or more embodiments of the present invention and an enlarged view corresponding to part III of FIG. 1, and FIG. 11B is a plan view corresponding to FIG. 11A.

FIG. 12C is a cross-sectional view showing an operation of the electronic component testing apparatus using a modification of the transport unit in one or more embodiments of the present invention (part 3) for testing the DUT.

FIG. 12E is a cross-sectional view showing an operation of the electronic component testing apparatus using a modification of the transport unit in one or more embodiments of the present invention (part 5) for testing the DUT.

FIG. 12H is a cross-sectional view showing an operation of the electronic component testing apparatus using a modification of the transport unit in one or more embodiments of the present invention (part 8) for testing the DUT.

DETAILED DESCRIPTION

Hereinafter, embodiments of the present invention will be described with reference to the drawings.

Figure 13:
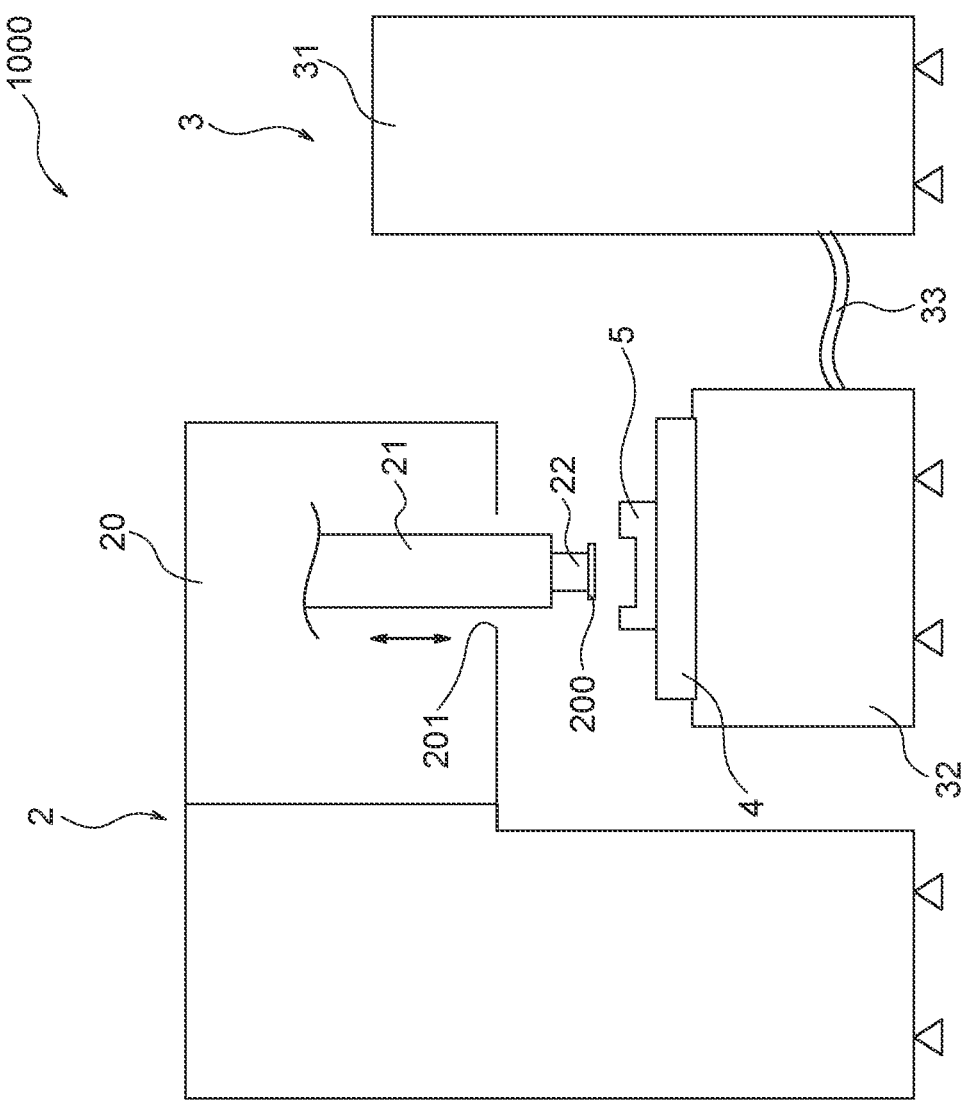
FIG. 13 is a schematic cross-sectional view showing the overall configuration of a conventional electronic component testing apparatus.

FIG. 13 is a schematic cross-sectional view showing the overall configuration of a conventional electronic component testing apparatus.

First Embodiment

A conventional electronic component testing apparatus 1000 is an apparatus for testing the electrical properties of the DUT 200 in a state where a high-temperature or low-temperature thermal stress is applied to the DUT 200 (or at room temperature), and classifying the DUT 200 according to the test results. The DUT 200 includes memory-based devices without antennas.

As shown in FIG. 13, the electronic component testing apparatus 1000 includes a handler 2 for moving the DUT 200, a tester 3 for executing a test of the DUT 200, a load board 4 mounted on a test head 32 (to be described later) of the tester 3, and a socket 5 mounted on the load board 4 and electrically connectable to the DUT 200.

The handler 2 in the present embodiment corresponds to an example of the "electronic component handling apparatus" in the present invention, the tester 3 in the present embodiment corresponds to an example of the "tester" in the present invention, the test head 32 in the present embodiment corresponds to an example of the "test head" in the present invention, and the socket 5 in the present embodiment corresponds to an example of the "first socket" in the present invention.

As shown in FIG. 13, the handler 2 includes a thermostatic chamber 20 and a contact arm 21. The handler 2 has a portion protruding laterally, and the thermostatic chamber 20 is accommodated in the protruding portion. The thermostatic chamber 20 includes an opening 201 formed at the bottom of the thermostatic chamber 20. Through the opening 201, the socket 5 is located inside the thermostatic chamber 20. The thermostatic chamber 20 may be capable of adjusting the temperature in a range of −55° C. to +155° C. although not limited.

The contact arm 21 is a device for moving the DUT 200, supported by rails (not shown) provided in the handler 2. The contact arm 21 includes an actuator (not shown) for horizontal movement and can move back and forth and left and right according to the rail. Further, the contact arm 21 includes an actuator (not shown) for vertical movement and can move in the vertical direction. The contact arm 21 includes a contact chuck 22 attached to the distal end of the contact arm 21 and is movable with holding the DUT 200. The contact arm 21 in the present embodiment corresponds to an example of the "contact arm" in the present invention.

As shown in FIG. 13, the tester 3 includes a main frame 31 and a test head 32. The main frame 31 is connected to the test head 32 via a cable 33. The main frame 31 sends test signals to the DUT 200 through the test head 32 to test the DUT 200 and evaluates the DUT 200 according to the test result.

The test head 32 is connected to the main frame 31 via cables 33 and sends test signals to the DUT 200 during testing. The test head 32 stores the pin electronics cards, which are electrically connected to the socket 5, in the test head 32 although not shown.

The load board 4 is a wiring board mounted on the test head 32 as shown in FIG. 13 and is electrically connected to the test head 32. On the upper surface of the load board 4, the socket 5 is mounted, the test signal sent from the tester 3 is sent to the socket 5 via the load board 4. The socket 5 has a plurality of contact pins arranged corresponding to the input and output terminals of the DUT 200. The socket 5 is electrically connected to the DUT 200 in accordance with pressing the DUT 200 set on the socket 5 against the socket 5. The socket 5 in the present embodiment corresponds to an example of the "first socket" in the present invention.

The conventional electronic component testing apparatus 1000 holds the DUT 200, which is conveyed from the customer tray by the transfer arm, by the contact chuck 22 of the handler 2, and moves the DUT 200 to the socket 5 by the contact arm 21 to press the DUT 200 against the socket 5. With the DUT 200 pressed against the socket 5, the main frame 31 of the tester 3 sends test signals to the DUT 200 via the test head 32, the load board 4, and the socket 5 to test the electric characteristics of the DUT 200. After the test of the DUT 200 completed, the conventional testing apparatus holds the DUT 200 on the socket 5 by the contact chuck 22, moves the DUT 200 from the socket 5 by the contact arm 21, and stores the DUT 200 in the customer tray while classifying the DUT 200 according to the test result by the transfer arm.

Figure 4A:
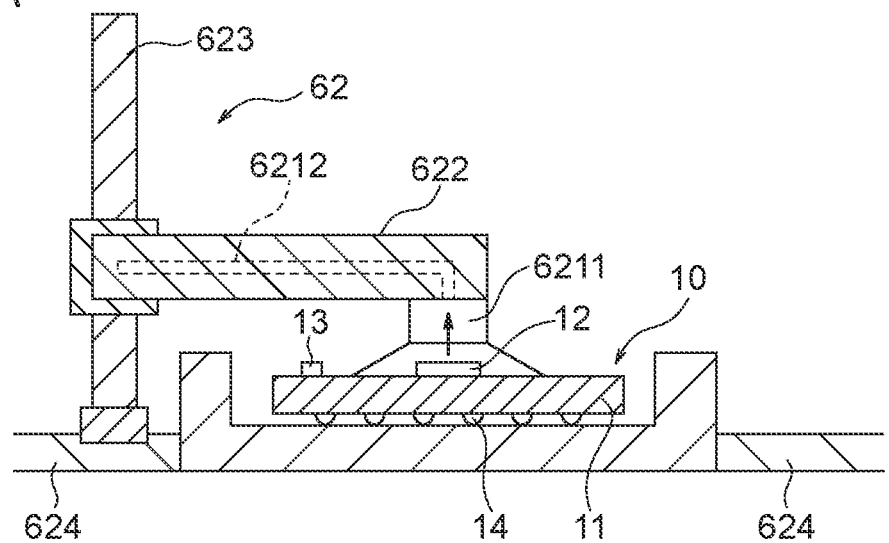
FIG. 4A is an enlarged cross-sectional view showing an operation of the transport unit in the first embodiment of the present invention to hold the DUT (part 1)

On the other hand, the DUT 10, which is the test target of the electronic component testing apparatus 1 in this embodiment, is a so-called AiP (Antenna in Package) device and has a device antenna 12 formed on the substrate 11 of the DUT 10 (see FIG. 4A). The OTA test of such DUT 10 needs to arrange measurement antenna above the DUT 10, which receives the radio waves radiated from the device antenna 12 or transmits radio waves to the device antenna 12.

However, the conventional electronic component testing apparatus 1000, as described above, performs the test while pressing the DUT 10 against the socket 5 by the contact arm 21. That is, the space above the DUT 10 is occupied by the contact arm 21 during testing of the DUT 10. This requires a drastic change of the design of the handler 2 to install the measuring antenna for the test of the DUT 10 with the antenna using the conventional electronic component testing apparatus 1000. This may increase the cost of the handler 2 or the cost of the DUT 10 OTA test.

Figure 1:
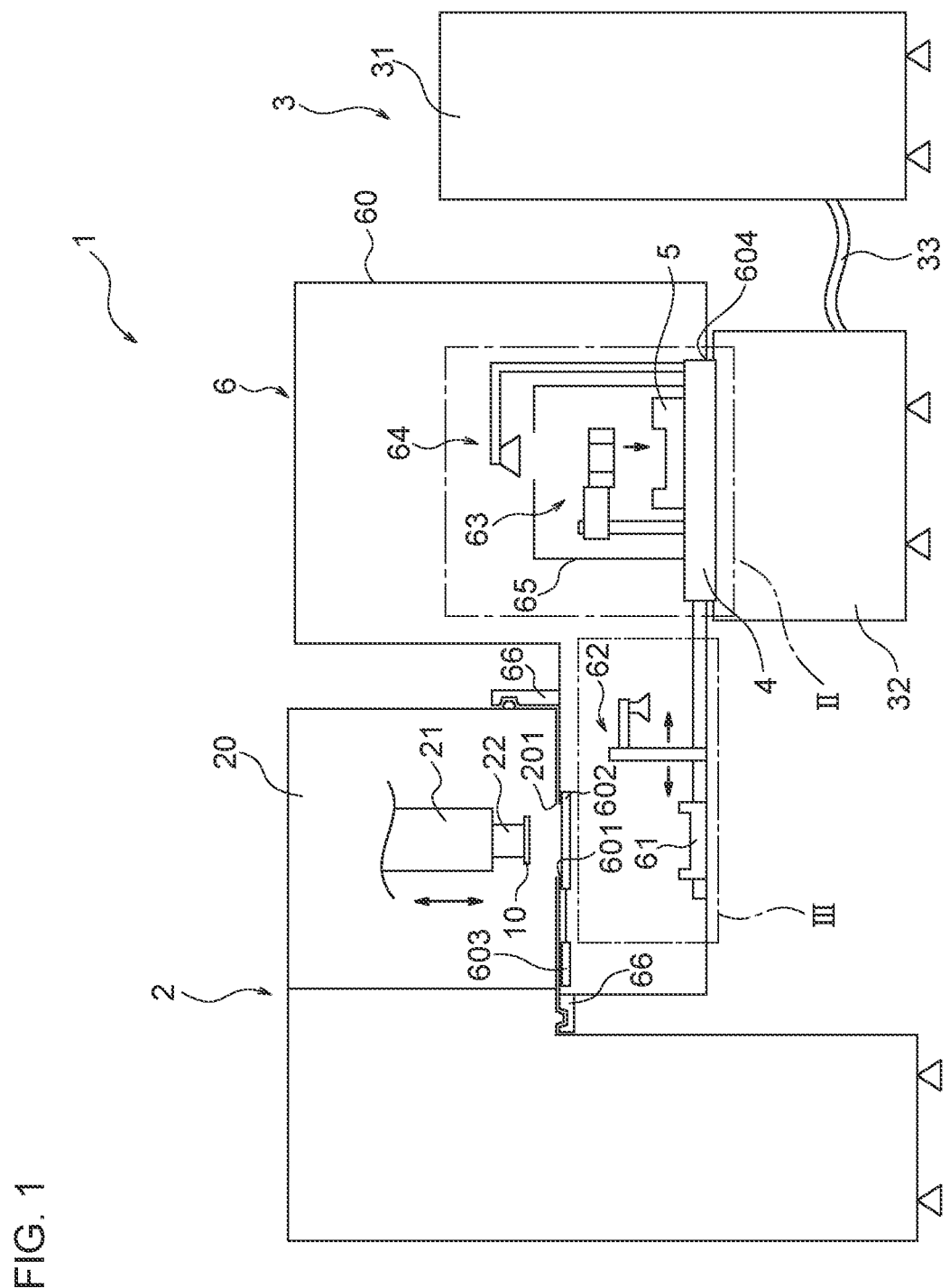
FIG. 1 is a schematic cross-sectional view showing an entire configuration of an electronic component testing apparatus in the first embodiment of the present invention.
Figure 2:
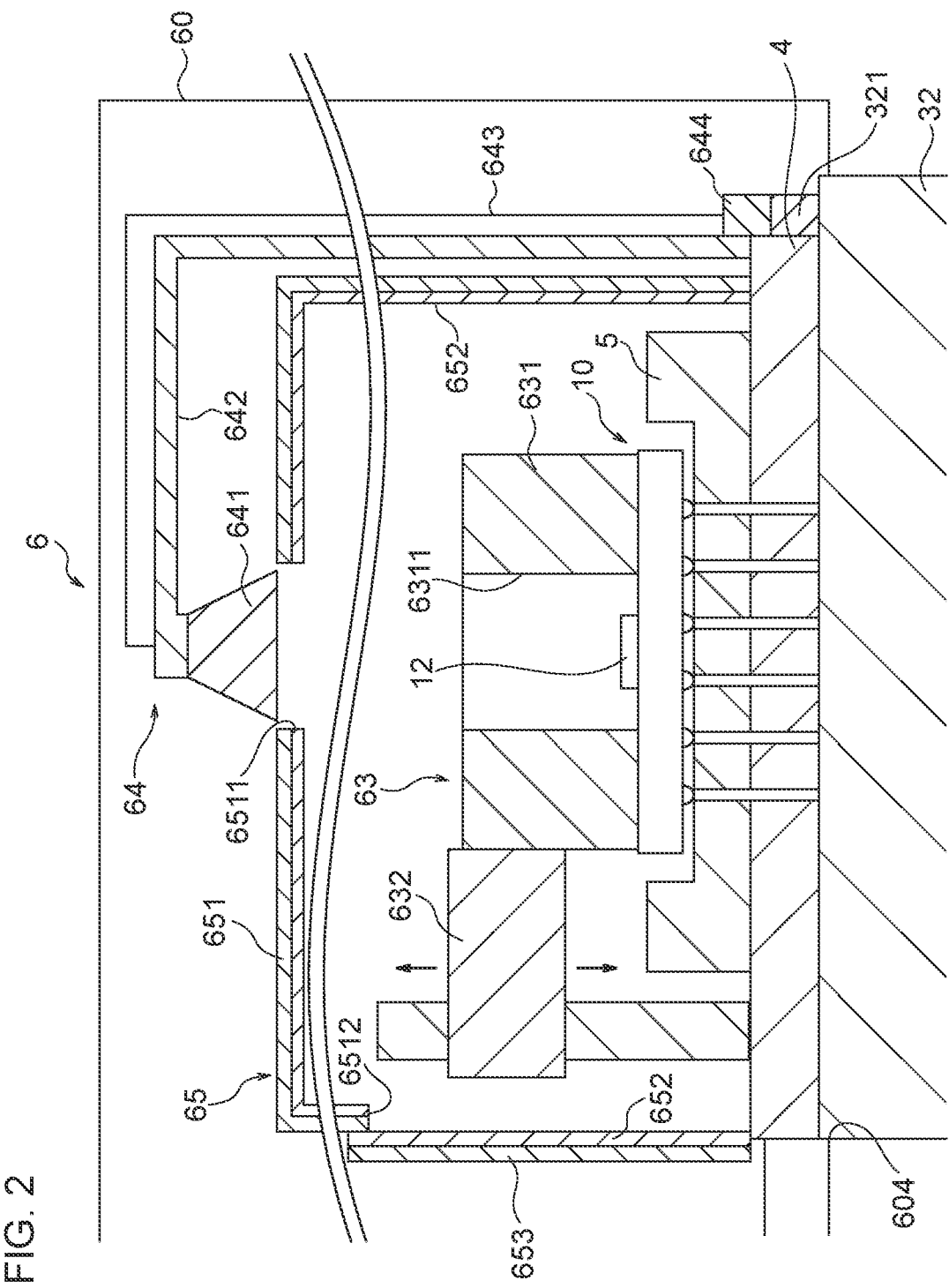
FIG. 2 is an enlarged view corresponding to part II of FIG. 1.

FIG. 1 is a schematic cross-sectional view showing the entire configuration of the electronic component testing apparatus according to the first embodiment of the present invention, and FIG. 2 is an enlarged view corresponding to part II of FIG. 1.

In contrast, the electronic component testing apparatus 1 in the present embodiment, as shown in FIG. 1, includes an electronic component pressing apparatus 6 that is respectively connectable to the handler 2 and the test head 32 (described later) in addition to the components of the conventional electronic component testing apparatus 1000. The electronic component pressing apparatus 6 includes an antenna unit 64 (described later) used in the OTA test of the DUT 10. The electronic component testing apparatus 1 according to the present embodiment including the electronic component pressing apparatus 6 can perform the OTA test without changing the designs of the handler 2. That is, the electronic component testing apparatus in the present embodiment uses the conventional handler 2 without changing the design by connecting the electronic component pressing apparatus 6 between the handler 2 and the test head 32 to configure the electronic component testing apparatus 1 for an AiP device.

The electronic component testing apparatus 1 in the present embodiment corresponds to an example of the "electronic component testing apparatus" in the present invention, the handler 2 in the present embodiment corresponds to an example of the "electronic component handling apparatus" in the present invention, the tester 3 in the present embodiment corresponds to an example of the "tester" in the present invention, the test head 32 in the present embodiment corresponds to an example of the "test head" in the present invention, the socket 5 in the present embodiment corresponds to an example of the "first socket" in the present invention, and the electronic component pressing apparatus 6 in the present embodiment corresponds to an example of the "electronic component pressing apparatus" in the present invention.

The electronic component testing apparatus 1 in the present embodiment is an apparatus for causing a test antenna 641 (to be described later) to receive radio waves (so-called millimeter waves) with a frequency of 24.250 GHz to 52.600 GHz radiated from the DUT 10 provided with the device antenna 12 in a far-field, testing the radio wave radiation characteristics of the DUT 10. This testing apparatus 1 also causes the DUT 10 to receive the millimeter waves radiated from the test antenna 641 in the far-field to test the radio wave reception characteristics of the DUT 10.

The DUT 10 to be tested includes a device antenna 12 formed on the upper surface of the substrate 11, a semiconductor chip 13 mounted on the upper surface of the substrate 11, and input-output terminals 14 formed on the lower surface of the substrate 11 (see FIG. 4A). The semiconductor chip 13 is a device for controlling the transmission and reception of the device antenna 12. Specific examples of the device antenna 12 may include patch antennas, dipole antennas, and Yagi antennas. The semiconductor chip 13 may be mounted on the lower surface of the substrate 11 although not shown.

The DUT 10 in the present embodiment corresponds to an example of the "DUT" in the present invention, and the device antenna 12 in the present embodiment corresponds to an example of the "device antenna" in the present invention.

The test head 32 in this embodiment, as shown in FIG. 2, includes a connector 321 which is connectable to a coaxial connector 644 (described later) provided with the antenna unit 64 (described later). The test head 32 receives the test signal sent from the antenna unit 64 via the connector 321 and sends it to the main frame 31.

The electronic component pressing apparatus 6 is a device that receives the DUT 10 carried by the contact arm 21 of the handler 2 and moves the DUT 10 to the sockets 5 mounted on the load board 4. The electronic component pressing apparatus 6 includes a chamber 60, a holding plate 61 on which the DUT 10 is set, a transport unit 62 for moving the DUT 10 between the holding plate 61 and the socket 5, a pusher unit 63 capable of pressing the DUT 10 against the socket 5, an antenna unit 64 used for testing the DUT 10, the anechoic chamber 65 surrounding the socket 5 and the antenna unit 64, and a fixing member 66 for fixing the chamber 60 to the handler 2.

The chamber 60 in the present embodiment corresponds to an example of the "first case" in the present invention, the holding plate 61 in the present embodiment corresponds to an example of the "holding plate" in the present invention, the transport unit 62 in the present embodiment corresponds to an example of the "transport unit" in the present invention, and the fixing member 66 in the present embodiment corresponds to an example of the "fixing member" in the present invention.

The chamber 60 is a box connected to the thermostatic chamber 20 of the handler 2 and connected to the test head 32, storing the holding plate 61, the transport unit 62, the pusher unit 63, and the antenna unit 64. The chamber 60 includes an opening 601 formed at a position corresponding to the holding plate 61 disposed in the chamber 60, a shutter 602 capable of closing the opening 601, an actuator 603 for operating the shutter 602, and an opening 604 formed at a position facing the pusher 631 (described later) of the pusher unit 63.

The opening 601 in the present embodiment corresponds to an example of the "first opening" in the present invention, and the opening 604 in the present embodiment corresponds to an example of the "second opening" in the present invention.

As shown in FIG. 1, the chamber 60 is fixed to the handler 2 by the fixing member 66 with the opening 601 of the chamber 60 facing the opening 201 of the thermostatic chamber 201. The fixing member 66 includes a fixing piece rotatably attached to the outside of the chamber 60 and has a locking pawl at the tip of the fixing piece engageable with a hook provided on the side surface of the handler 2. The electronic component pressing apparatus 6 locks the rotation of the fixing member 66 with the fixing member 66 engaged with the hook of the handler 2 to secure the chamber 60 to the handler 2. The configuration of the fixing member 66 is not limited to that, and for example, the chamber 60 and the handler 2 may be fixed by screwing. The opening 201 in the present embodiment corresponds to an example of the "third opening" in the present invention.

Opening the shutter 602 by an actuator 603 such as an electric cylinder during the test of the DUT 10 connects the space in the thermostatic chamber 20 to the space in the chamber 60. Further, the electronic component pressing apparatus 6 is connected to the test head 32 through the opening 604, the socket 5 mounted on the load board 4 is positioned in the chamber 60.

Connecting the space in the thermostatic chamber 20 to the space in the chamber 60 enables to adjust the temperature in the chamber 60 in the same temperature range as the temperature adjustment range of the thermostatic chamber 20 using the thermostatic chamber 20. The chamber 60 itself may be provided with a temperature adjusting device, and the temperature inside the chamber 60 may be regulated by the temperature adjusting device.

For any failure of transporting the DUT 10 in the handler 2 during the DUT 10 test, the space in the thermostatic chamber 20 may be opened to the outside air to eliminate the failure. At this time, outside air flows into the chamber 60 through the opening 601 if the chamber 60 does not include a shutter. The inflow of the outside air quickly changes the temperature inside the chamber 60 at low temperature condition, may generate moisture. The moisture may adhere to the DUT 10.

In contrast, the electronic component pressing apparatus 6 in the present embodiment can seal the space in the chamber 60 by closing the opening 601 with the shutter 602. The electronic component pressing apparatus 6 in the present embodiment can prevent the inflow of outside air into the chamber 60 using the shutter 602 if the space in the thermostatic chamber 20 needs to open to the outside air during the test of the DUT 10 at low temperature conditions. This allow to reduce the adhesion of moisture to the DUT 10.

Figure 4B:
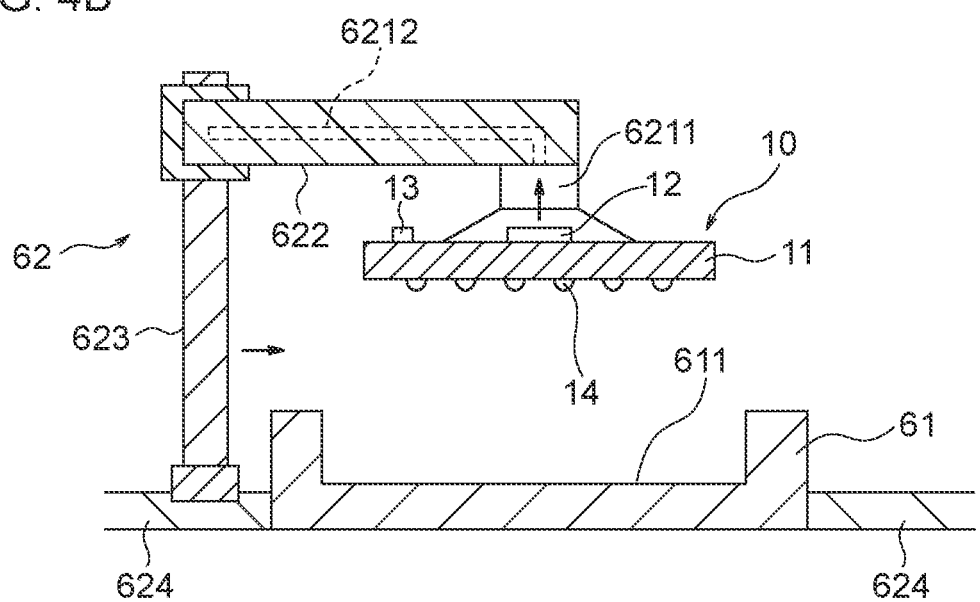
FIG. 4B is an enlarged cross-sectional view showing an operation of the transport unit in the first embodiment of the present invention to hold the DUT (part 2).

FIG. 3A is an enlarged view corresponding to the III portion of FIG. 1, FIG. 3B is a plan view corresponding to FIG. 3A, FIG. 4A is an enlarged cross-sectional view showing an operation of the transport unit in the present embodiment to hold the DUT (part 1), FIG. 4B is an enlarged cross-sectional view showing an operation of the transport unit in the present embodiment to hold the DUT (part 2).

As shown in FIG. 1, the holding plate 61 is disposed at a position corresponding to the opening 601 of the chamber

60. The holding plate 61, as shown in FIG. 4A and FIG. 4B, which includes a recess 611, is possible to hold the DUT 10 transported by the contact arm 21 in the recess 611. The material of the holding plate 61 includes aluminum although not limited.

The transport unit 62, as shown in FIGS. 3A and 3B, includes a holding portion 621, a vertical moving unit 622, a horizontal moving unit 623, and a guide rail 624.

As shown in FIGS. 4A and 4B, the holding portion 621 includes a suction pad 6211, a suction pipe 6212, and a vacuum pump (not shown). One end of the suction pipe 6212 is in communication with the suction pad 6211, the other end of the suction pipe 621b is connected to the vacuum pump. The suction pad 6211 is in communication with the suction pipe 6212 and opens downward. The suction pad 6211 determines a sealed space surrounded by the suction pad 6211 and the DUT 10 by contacting the DUT 10. The holding portion 621 sucks and holds the DUT 10 by sucking the air in the sealed space by the vacuum pump.

The holding portion 621, as shown in FIG. 3B, is attached to the vertical moving unit 622 to be positioned on a virtual straight line L connecting the holding plate 61 and the socket 5 in a plan view. The holding portion 621 can move horizontally along the guide rail 624 by the horizontal moving unit 623 to the positions directly above each of the holding plate 61 and the socket 5.

The vertical moving unit 622, which is connected to an actuator (not shown), as shown in FIG. 4A and FIG. 4B, is possible to move the holding portion 621 up and down.

The horizontal moving unit 623, which is connected to an actuator (not shown), as shown in FIG. 3A and FIG. 3B, is possible to move the holding portion 621 in the horizontal direction.

The guide rail 624, as shown in FIG. 3B, is disposed substantially parallel to the virtual straight-line L connecting the holding plate 61 and the socket 5. The length of the guide rail 624, as shown in FIG. 3A and FIG. 3B, is set longer than the distance between at least the holding plate 61 and the socket 5.

The pusher unit 63, as shown in FIG. 2, includes a pusher 631 capable of pressing the DUT 10 to the socket 5, and a drive unit 632 for automatically moving the pusher 631 in the vertical direction. The pusher 631 can press the DUT 10 to the socket 5 using the drive unit 632 with the lower surface of the pusher 631 in contact with the DUT 10. The pusher 631 includes an opening 6311 penetrating the pusher 631 in the vertical direction, through the opening 6311, the DUT 10 faces the test antenna 641 of the antenna unit 64 (described later) with the pusher in contact with DUT 10. The drive unit 632, although not limited, is formed of an electric cylinder, and is fixed to the chamber 60 around the opening 604.

The pusher 631 in the present embodiment corresponds to an example of the "pusher" in the present invention, and the opening 6311 in the present embodiment corresponds to an example of the "fourth opening" in the present invention.

The antenna unit 64, as shown in FIG. 2, includes a test antenna 641, a support 642, a communication line 643, and a coaxial connector 644. The test antenna 641 in the present embodiment corresponds to an example of the "measurement antenna" in the present invention.

The test antenna 641 is an antenna for receiving radio waves radiated from the device antenna 12 of the DUT 10 and radiating radio waves to the device antenna 12 of the DUT 10. The test antenna 64, which is disposed on the opposite side of the socket 5 with respect to the pusher 631, faces the socket 5 through the opening 6311 of the pusher 631. The test antenna 641 faces the device antenna 12 of the DUT 10 by placing the DUT 10 on the socket 5.

The distance between the device antenna 12 of the test antenna 641 and the DUT 10 is adjusted so that the radio waves radiated from the device antenna 12 can reach the test antenna 641 in far-field. The test antenna 641, for example, includes a horn antenna although not limited.

The support 642, which is a member for fixing the test antenna 641, is fixed to the chamber 60 and is mounted detachably to the load board 4.

The communication line 643 is connected to the coaxial connector 644 connected to the connector 321 of the test head 32 and the test antenna 641, and has a function of transmitting electrical signals to each other between the test antenna 641 and the coaxial connector 644.

The anechoic chamber 65, as shown in FIG. 2, includes a shield box 651, a radio wave absorber 652 disposed on the inner wall of the shield box 651, and a shutter 653 capable of closing an opening 6512 formed on the side surface of the shield box 651 (described later). The anechoic chamber 65 is arranged to cover the socket 5 and the pusher unit 63, as shown in FIG. 2.

The shield box 651 is a metal box including a metal such as aluminum. The shield box 651 has a function of blocking radio waves from the outside. The shield box 651 in the present embodiment corresponds to an example of the "second case" in the present invention.

The shield box 651 includes an opening 6511 formed at a position facing the test antenna 641, through the opening 6511, the test antenna 641 disposed outside the anechoic chamber 65 is opposed to the socket 5. Further, the shield box 651 includes the opening 6512 formed on the side surface of the shield box 651, the transport unit 62 holding the DUT 10 through the opening 6512 can move into the anechoic chamber 65 through the opening 6512.

The radio wave absorber 652, which is disposed on the inner wall of the shield box 651, prevents the intrusion of unnecessary radio waves from the outside, and eliminates the reflection of internal radio waves. The radio wave absorber 652 has, for example, a plurality of quadrangular pyramid-shaped members is arranged. The material constituting the radio wave absorber 652 includes, for example, ferrite and a resin material. The radio wave absorber 652 in the present embodiment corresponds to an example of the "radio wave absorber" in the present invention.

The shutter 653 is attached to the side surface of the shield box 651 to close the opening 6512 of the shield box 651. The shutter 653 has the radio wave absorber 652 on the side facing the inside of the shield box 651. The shutter 653, by closing the opening 6512, allows to prevent the unnecessary radio waves from entering from the outside through the opening 6512 and eliminate the reflection of internal radio waves.

Hereinafter, the OTA test of the DUT 10 using the electronic component testing apparatus 1 in the present embodiment will be described with reference to FIG. 5A to FIG. 5F.

Figure 5A:
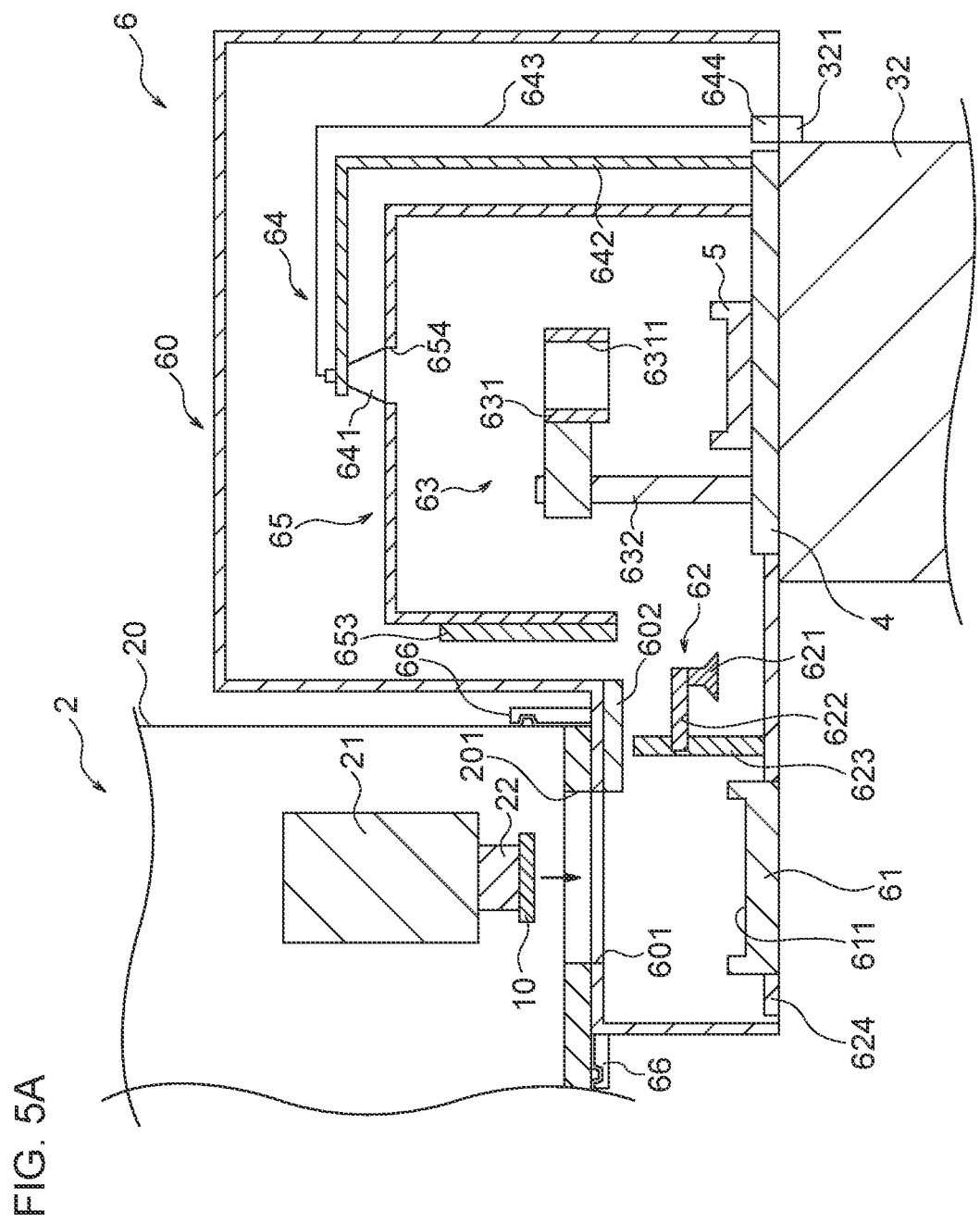
FIG. 5A is a cross-sectional view (part 1) showing an operation of the electronic component testing apparatus according to the first embodiment for testing the DUT.

First, fixing the chamber 60 to the handler 2 by fixing member 66 with the opening 601 of the chamber 60 opposite to the opening 201 of the thermostatic chamber 20 causes the handler 2 to connect to the electronic component pressing apparatus 6. Further, entering the socket 5 into the chamber 60 through the opening 604 causes the test head 32 to connect to the electronic component pressing apparatus 6. Then, as shown in FIG. 5A, opening the shutter 602 of the chamber 60 communicates the space in the thermostatic chamber 20 with the space in the chamber 60. Additionally, the shutter 653 of the anechoic chamber 65 is also open when the shutter 602 opening.

Next, the thermostatic chamber 20 adjusts the temperature in the thermostatic chamber 20 and the chamber 60 to a predetermined temperature. For the chamber 60 itself including a temperature adjusting device, the temperature in the chamber 60 may be adjusted by the temperature adjusting device instead of the thermostatic chamber 20.

As shown in FIG. 5A, the contact chuck 22 of the handler 2 holds the DUT 10, and the contact arm 21 moves the DUT 10 to just above the opening 201 and the holding plate 61.

Figure 5B:
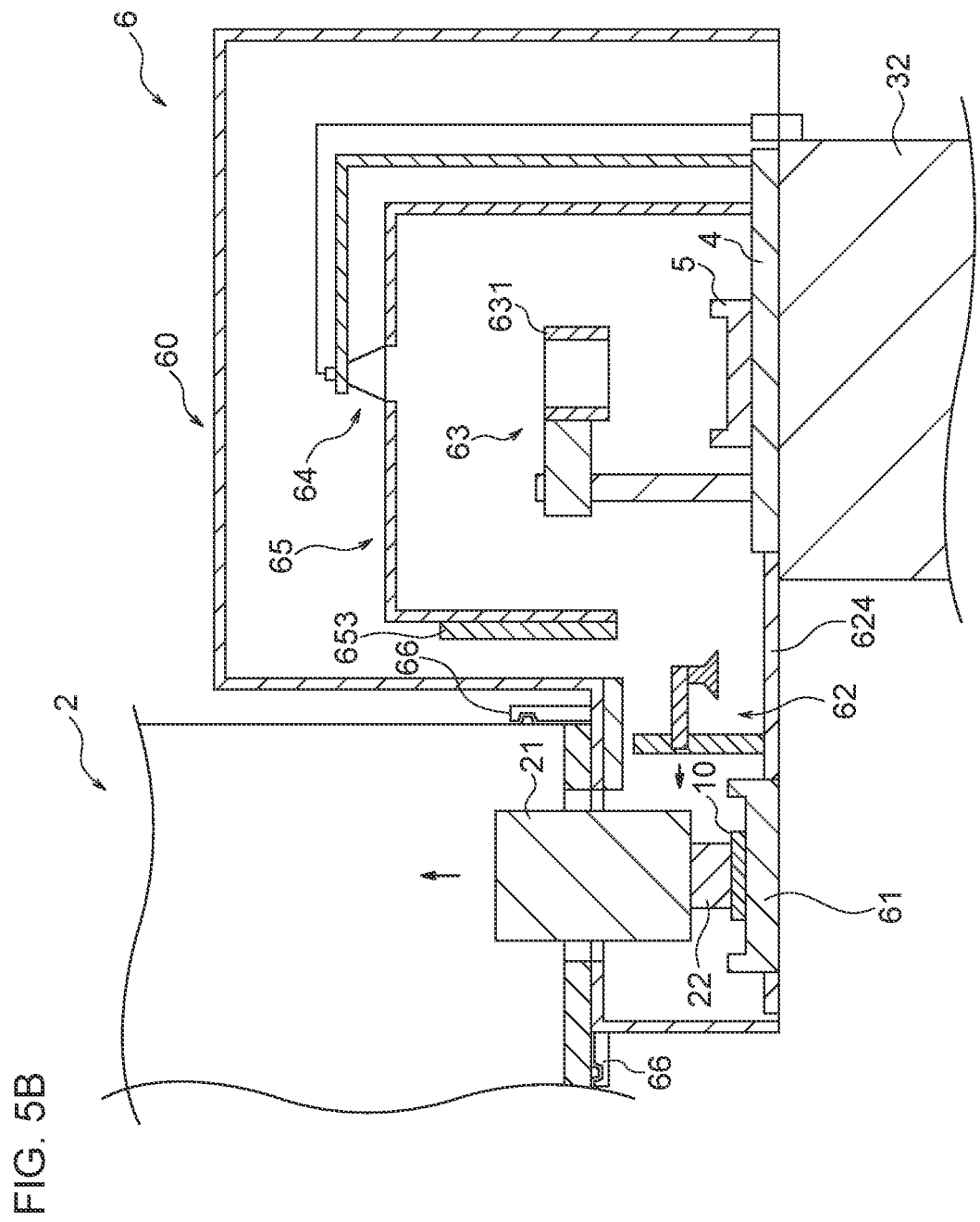
FIG. 5B is a cross-sectional view (part 2) showing an operation of the electronic component testing apparatus according to the first embodiment for testing the DUT.

As shown in FIG. 5B, the contact arm 21 goes down to move the DUT 10 to the holding plate 61 through the opening 201 and the opening 601. The contact chuck 22 releases the DUT 10 with the DUT 10 contacting the holding plate 61, then the contact arm 21 rises.

The transport unit 62 moves horizontally by the horizontal moving unit 623 to locate the suction pad 6211 of the holding portion 621 directly above the DUT 10 placed on the holding plate 61. The holding portion 621 is lowered by the vertically moving unit 622, and the openings of the suction pad 6211 are brought into contact with the DUT 10. The vacuum pump connected to the suction pipe 621b starts and causes the holding portion 621 to hold the DUT 10 by suction.

As shown in the drawing 5C, the holding portion 621 is raised by the vertically moving unit 622 while the holding portion 621 holding the DUT 10 by suction.

Figure 5D:
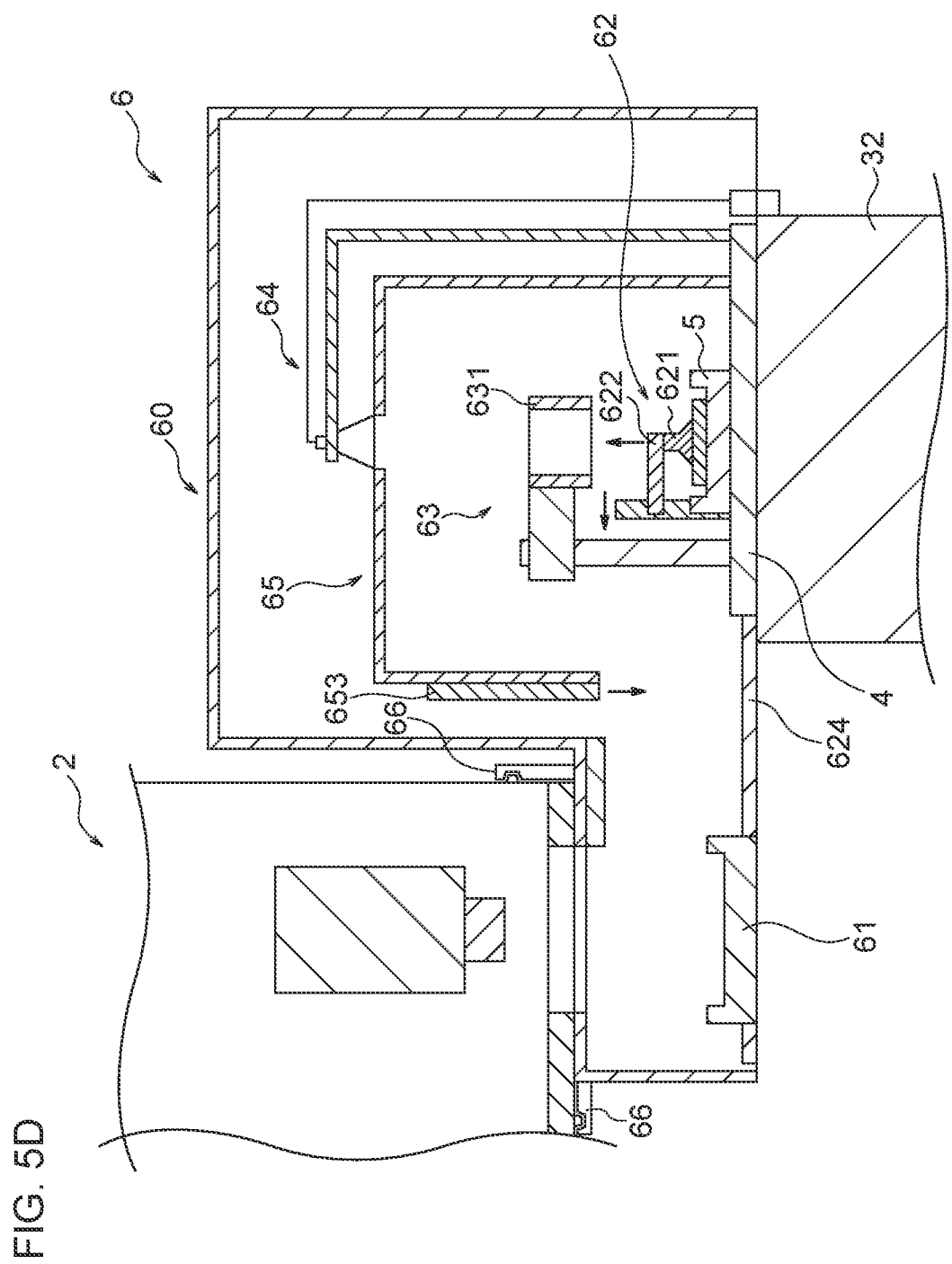
FIG. 5D is a cross-sectional view (part 4) showing an operation of the electronic component testing apparatus according to the first embodiment for testing the DUT.

The horizontal moving unit 623 moves the transport unit 62 horizontally to move the DUT 10 to directly above the socket 5. As shown in FIG. 5D, the vertical moving unit 622 moves the DUT 10 to the socket 5. The suction of the DUT 10 by the holding portion 621 stops to place the DUT 10 on the sockets 5, and the holding portion 621 is raised by the vertically moving unit 622.

Figure 5E:
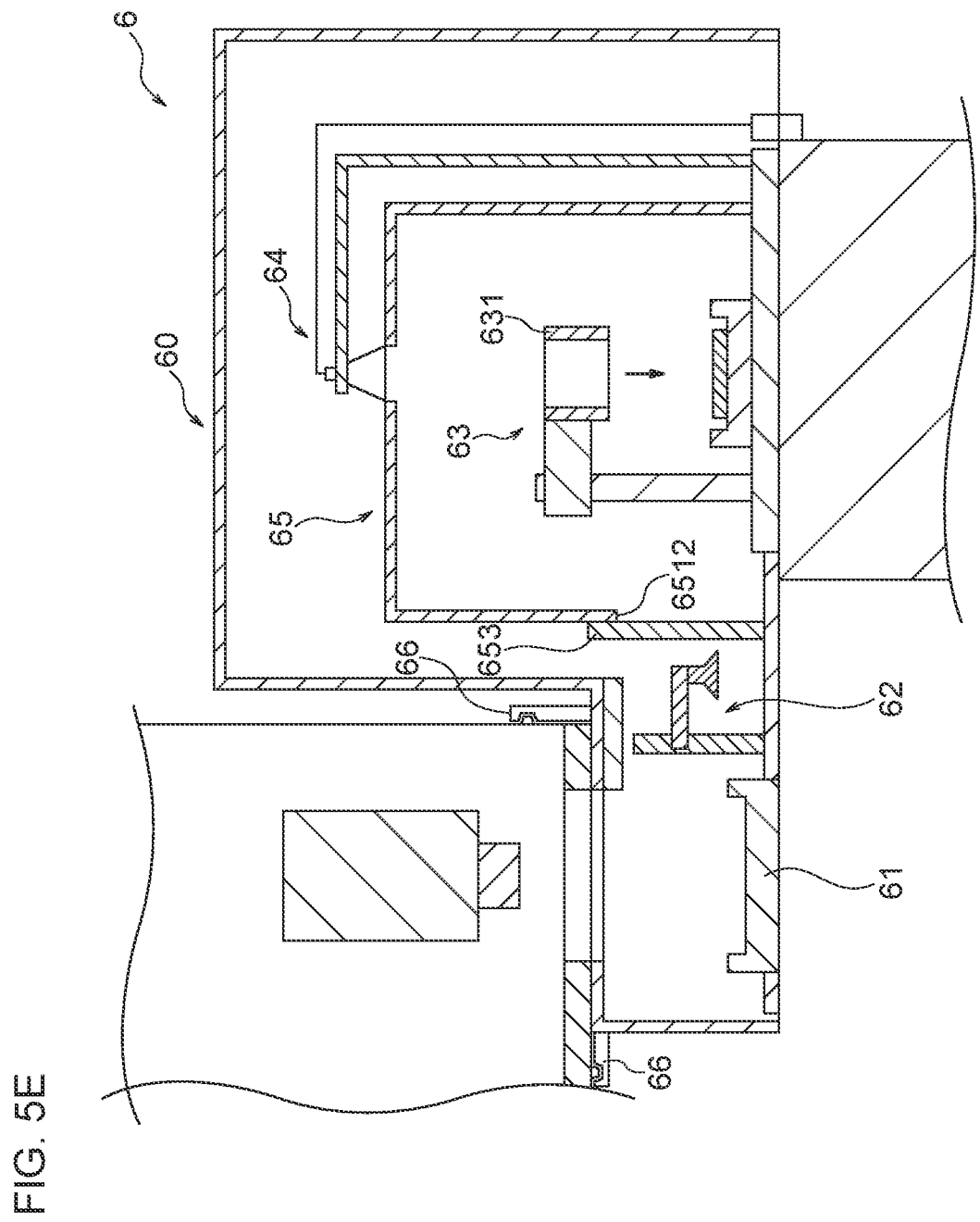
FIG. 5E is a cross-sectional view (part 5) showing an operation of the electronic component testing apparatus according to the first embodiment for testing the DUT.

As shown in FIG. 5E, the transport unit 62 moves to the outside of the anechoic chamber 65 by the horizontal moving unit 623, and the shutter 653 closes the opening 6512. The pusher 631 lowered by the drive unit 632 of the pusher unit 63 presses the DUT 10 to the socket 5.

Figure 5F:
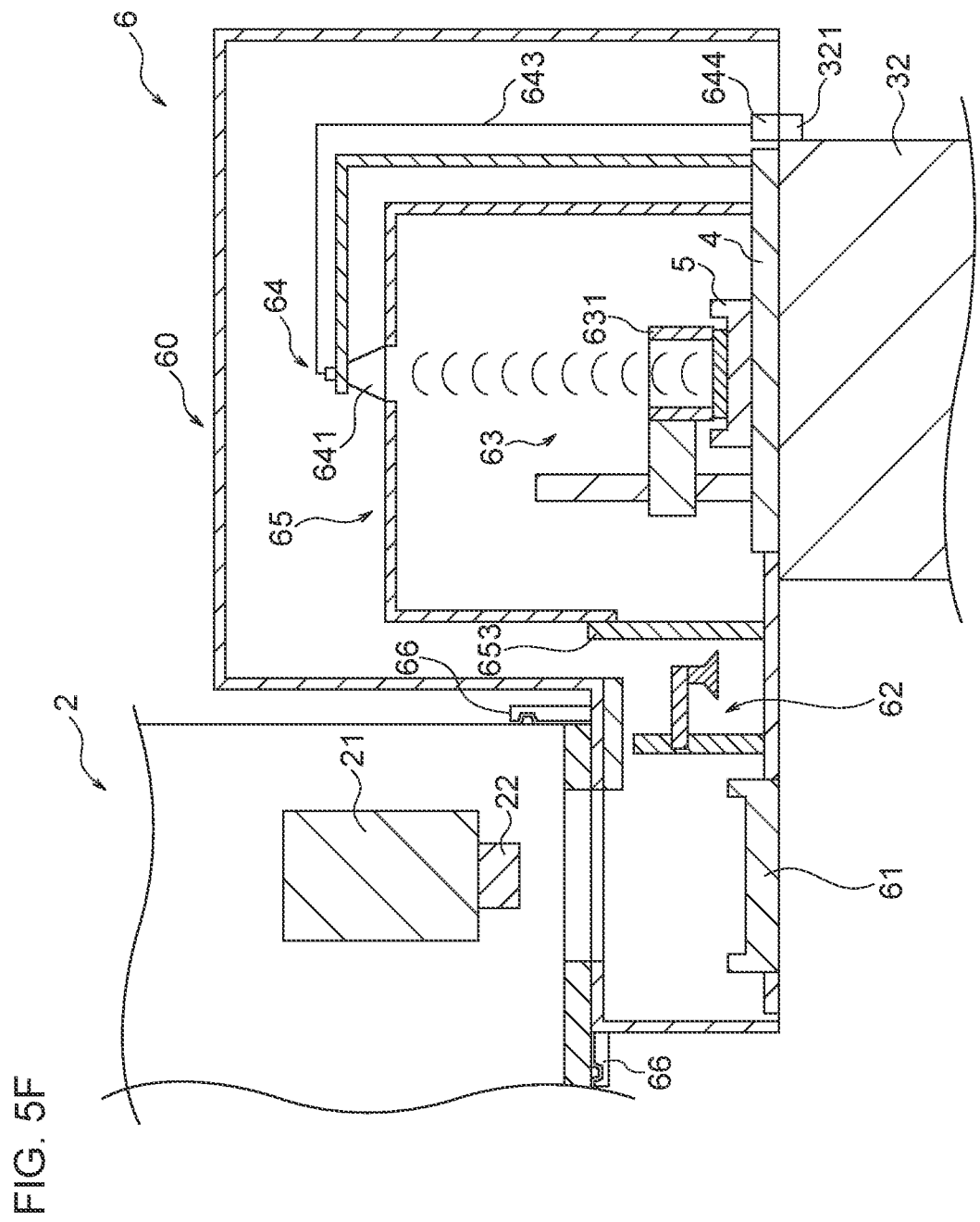
FIG. 5F is a cross-sectional view (part 6) showing the operation of the electronic component testing apparatus according to the first embodiment for testing the DUT.

As shown in FIG. 5F, while pressing the DUT 10 against the socket 5, the following DUT 10 test for determining the characteristics of the radio wave radiation and reception is performed.

Specifically, the test signals outputted from the main frame 31 are transmitted to the DUT 10 via the load board 4 and the socket 5 mounted on the test head 32. The DUT 10 receiving the test signal radiates radio waves upward from the device antenna 12. The radio wave is received by the test antenna 641, converted into an electric signal, sent to the main frame 31 via communication line 643, the coaxial connector 644, the connector 321, and the test head 32. The radio wave radiation characteristic of the DUT 10 is evaluated using the signal.

Then, while keeping the DUT 10 pressed against the socket 5, the test signal outputted from the main frame 31 is sent to the test antenna 641 via the coaxial connector 644 and the communication line 643. The test antenna 641 radiates a radio wave downward. This radio wave is received by the device antenna 12 of the DUT 10 and is converted into an electric signal. The electric signal is sent to the main frame 31 via the socket 5 and the load board 4. The radio wave reception characteristic of the DUT 10 is evaluated using the signal.

After evaluating the DUT 10, the drive unit 632 raises the pusher 631 with the shutter 653 of the anechoic chamber 65 open, the transport unit 62 moves the DUT 10 from the socket 5 to the holding plate 61. Then, the contact arm 21 of the handler 2 goes down and rises to raise the DUT 10 from the holding plate 61 with the DUT 10 held by the contact chuck 22. The DUT 10 is stored in the customer tray while being classified according to the test results by the transfer arm and is exported from the handler 2 to a later step. This completes the DUT 10 test.

As described above, in the present embodiment, the electronic component pressing apparatus 6 receives the DUT 10 from the handler 2 and moves the DUT 10 to the socket 5 connected to the tester 3. Using such electronic component pressing apparatus 6 allows to perform the radio wave radiation characteristic test of the DUT having an antenna on the upper surface of the device using the existing electronic component handling apparatus. This allows to reduce the cost of testing the DUT including an antenna.

The Second Embodiment

The electronic component testing apparatus 1B in this embodiment is different from the first embodiment in testing radio wave radiation characteristic of the DUT 10 in near-field, in not including an anechoic chamber, and in the structure of the pusher unit 63B and the antenna unit 64B. Other configurations are the same as the first embodiment. Hereinafter, the electronic component testing apparatus 1B according to the second embodiment will be described only with respect to the difference from the first embodiment. The same reference numerals are assigned to the same components as those of the first embodiment, and descriptions thereof will be omitted.

Figure 6B:
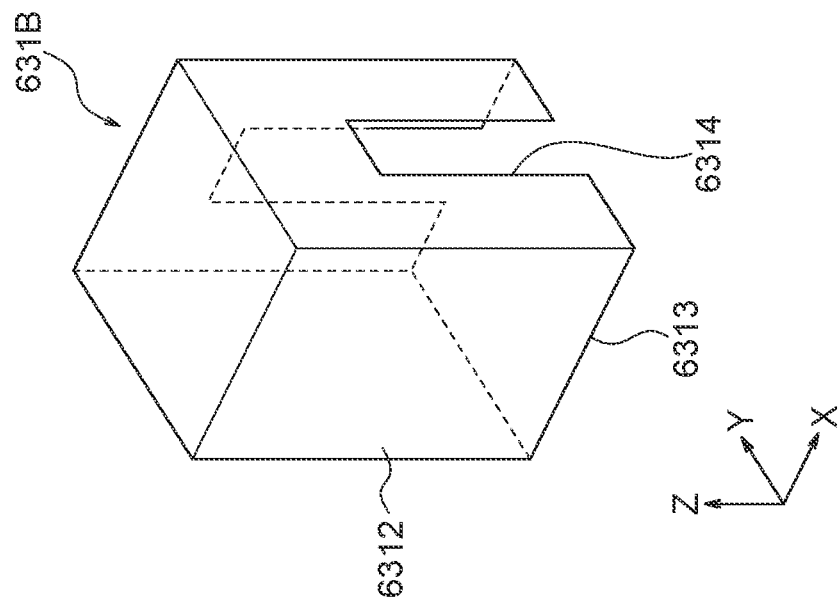
FIG. 6B is a perspective view showing a pusher in the second embodiment of the present invention.
Figure 6A:
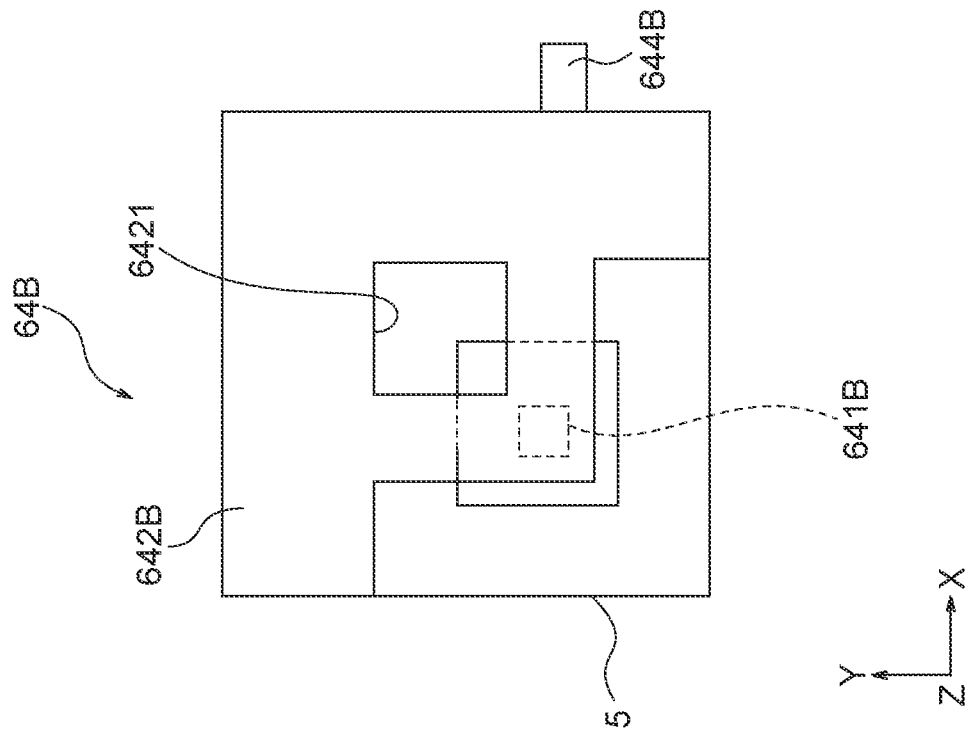
FIG. 6A is a plan view showing an antenna unit in the second embodiment of the present invention.

FIG. 6A is a plan view showing an antenna unit in the present embodiment, FIG. 6B is a perspective view showing a pusher in the present embodiment, FIG. 7A is an enlarged view (part 1) corresponding to Part III of FIG. 1 in the present embodiment, and FIG. 7B is an enlarged view (part 2) corresponding to Part III of FIG. 1 in the present embodiment.

The antenna unit 64B in this embodiment, as shown in FIG. 6A and FIG. 7A, includes a test antenna 641B, a support 642B, a communication line 643B, and a coaxial connector 644B. The test antenna 641B in the present embodiment corresponds to an example of the "measurement antenna" in the present invention, the support 642B in the present embodiment corresponds to an example of the "support" in the present invention, the coaxial connector 644B in the present embodiment corresponds to an example of the "first connector" in the present invention.

The test antenna 641B, as shown in FIG. 6A and FIG. 7A, is disposed on the lower surface of the support 642B to face the socket 5, the relative positional relation between the test antenna 641B and the socket 5 is fixed. The distance between the test antenna 641B and the device antenna 12 of the DUT 10 placed on the socket 5 is adjusted so that radio waves radiated from the device antenna 12 can reach the test antenna 641B in the near-field. The test antenna 641B includes a patch antenna (microstrip antenna) and a horn antenna.

The support 642B, as shown in FIG. 7A, is a member for supporting the test antenna 641B and is attachable to the socket 5. Further, as shown in FIG. 6A, the support 642B includes an opening 6421 through which the contact portion 6312 of the pusher 631B can pass in a plan view.

The coaxial connector 644B, as shown in FIG. 6A and FIG. 7A, is attached to the support 642B and is electrically connected to the test antenna 641B via a wiring pattern formed on the lower surface of the support 642B (not shown).

The communication line 643B, as shown in FIG. 7A, is connected to the coaxial connector 644B at one end and is connected to the connector 321 of the test head 32 at the other end. The communication line 643B can transmit electrical signals to each other between the test antenna 641B and the connector 321.

The test antenna 641B may be connected to the tester 3 using a waveguide. For using a waveguide, for example, the test antenna 641B is connected to the tester 3 by connecting the waveguide to the coaxial connector 644B through the coaxial waveguide conversion adapter and connecting the waveguide to the test head 32. For using a waveguide to connect the test antenna 641B and the tester 3, the test antenna 641B and the tester 3 transmits and receives radio waves to each other.

The pusher unit 63B, as shown in FIG. 7A, includes a pusher 631B and a drive unit 632.

The pusher 631B, as shown in FIG. 6B, includes a cylindrical or hollow rectangular contact portion 6312. The contact portion 6312 includes an opening 6313 facing the first socket and a notch (or cut) 6314 formed on the side surface of the contact portion. As shown in the FIG. 7B, the contact portion 6312 can contact the DUT 10 set on the socket 5 to press the DUT 10 against the socket 5. The contact portion 6312 in the present embodiment corresponds to an example of the "contact portion" in the present invention, the opening 6313 in the present embodiment corresponds to an example of the "fifth opening" in the present invention, and the notch 6314 in the present embodiment corresponds to an example of the "notch" in the present invention.

The inner surface of the contact portion 6312 may be covered with a radio wave absorber. As the radio wave absorber, the same material as the radio wave absorber 652 of the above-mentioned anechoic chamber 65 can be used. The radio wave absorber eliminates the reflection of radio waves in the contact portion 6312.

In addition, the radio wave absorber may be disposed inside the opening 6313 of the contact portion 6312 so that the radio wave absorber is interposed between the measurement antenna 641B and the device antenna 12. This relatively shortens the actual distance between the test antenna 641B and the device antenna 12 while maintaining the distance on the radio communication between the test antenna 641B and the device antenna 12. This allows to reduce the size of the pusher unit 63B.

The notch 6314 formed in the pusher 631B, as shown in FIG. 7B, enables the support 642B of the antenna unit 64B to enter the side surface of the pusher 631B. This allows the test antenna 641B attached to the support 642B to position inside the pusher 631B.

The OTA test of the DUT 10 performed by the electronic component testing apparatus 1B according to the present embodiment will be described below. The process up to mounting the DUT 10 on the sockets 5 is the same as the OTA test in the first embodiment except eliminating the process relating to the anechoic chamber. As shown in FIG. 7B, while the DUT 10 is pressed against the socket 5 by the pusher 631B, the following test for determining the characteristics of the radio wave radiation and radio wave reception characteristics of the DUT 10 is performed.

Specifically, the test signal outputted from the main frame 31 is sent to the DUT 10 via the socket 5. The DUT 10 radiates radio waves upward from the device antenna 12. This radio wave is received by the test antenna 641B and is converted into an electric signal. The electric signal is sent to the main frame 31 via the coaxial connector 644B, the communication line 643B, and the test head 32. The radio wave radiation characteristic of the DUT 10 is evaluated using the signal.

Then, while keeping the DUT 10 pressed against the socket 5, the test signal outputted from the main frame 31 is sent to the test antenna 641B via the communication line 643B and the coaxial connector 644B. The test antenna 641 radiates a radio wave downward. This radio wave is received by the device antenna 12 of the DUT 10 and is converted into an electric signal. The electric signal is sent to the main frame 31 via the socket 5. The radio wave reception characteristics of the DUT 10 is evaluated using the signal.

After evaluating the DUT 10, the drive unit 632 raises the pusher 631 and the transport unit 62 moves the DUT 10 from the socket 5 to the holding plate 61. Then, the contact arm 21 of the handler 2 goes down and rises to raise the DUT 10 from the holding plate 61 with the DUT 10 held by the contact chuck 22.

As described above, in the present embodiment, the electronic component pressing apparatus 6B receives the DUT 10 from the handler 2, and the moves the DUT 10 to the socket 5 connected to the tester 3. Using such electronic component pressing apparatus 6B in the present embodiment allows to perform the radio wave radiation characteristic test of the DUT having an antenna on the upper surface of the device using the existing electronic component handling apparatus. This allows to reduce the cost of testing the DUT including an antenna.

Additionally, the electronic component testing apparatus in the present embodiment does not attach or detach any connector in the transmission path from the antenna 641B to the test head 32 when testing the DUT 10. That is, the transmission path from the antenna 641B to the test head 32 is fixed. This stabilizes the connection between the antenna 641B and the test head 32, enables to improve the accuracy of the test of the device antenna 12 of the DUT 10.

The Third Embodiment

The electronic component testing apparatus 1C in this embodiment is different from the first embodiment in testing radio wave radiation characteristic of the DUT 10 in near-field, in not including an anechoic chamber, and in the structure of the pusher unit 63C and the antenna unit 64C. Other configurations are the same as the first embodiment. Hereinafter, the electronic component testing apparatus 1C according to the third embodiment will be described only with respect to the difference from the first embodiment. The same reference numerals are assigned to the same components as those of the first embodiment, and descriptions thereof will be omitted.

Figure 8A:
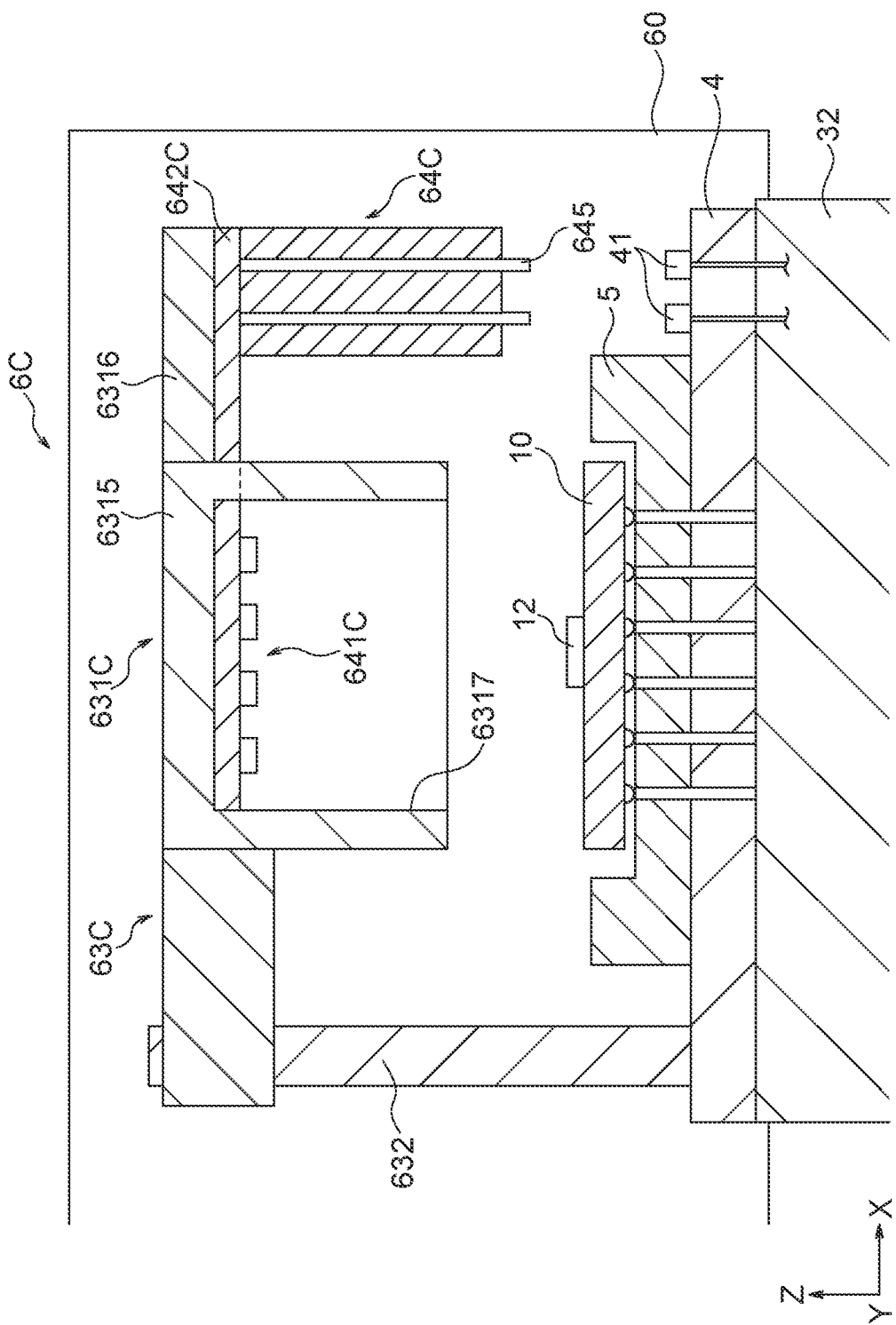
FIG. 8A is an enlarged view (part 1) corresponding to part II of FIG. 1 according to the third embodiment of the present invention.

FIG. 8A is an enlarged view (part 1) corresponding to Part II of FIG. 1 in the present embodiment, and FIG. 8B is an enlarged view (part 2) corresponding to Part II of FIG. 1 in the present embodiment.

The pusher unit 63C in the present embodiment includes a pusher 631C and a drive unit 632.

As shown in the drawing 8A, the pusher 631C includes a contact portion 6315 having a rectangular cylindrical shape, and a protruding portion 6316 protruding to the side of the contact portion 6315. The contact portion 6315 is made of, for example, a conductive material such as a metal material. The contact portion 6315 includes the opening 6317 facing the socket 5 at the lower end, the opening 6317 has a size enough to surround the device antenna 12 of the DUT 10.

The inner wall of the contact portion 6315 may be covered with a radio wave absorber. As the material of the radio wave absorber, the same material as the radio wave absorber 652 of the above-mentioned anechoic chamber 65 can be used. The radio wave absorber eliminates the reflection of radio waves in the contact portion 6315.

In addition, the radio wave absorber may be disposed inside the opening 6317 of the contact portion 6315 so that the radio wave absorber is interposed between the measurement antenna 641C and the device antenna 12. This relatively shortens the actual distance between the test antenna 641C and the device antenna 12 while maintaining the distance on the radio communication between the test antenna 641C and the device antenna 12. This allows to reduce the size of the pusher unit 63C.

The opening 6317 in the present embodiment corresponds to an example of the "sixth opening" in the present invention.

As shown in the drawing 8A, the antenna unit 64C includes a test antenna 641C, a substrate 642C, and pogo pins 645. A part of the antenna unit 64C is disposed inside the opening 6317 of the contact portion 6315 and the remaining part of the antenna unit 64C is fixed to the outside of the contact portion 6315, that is, to the protruding portion 6316 of the pusher 631C. The antenna unit 64C can receive radio waves transmitted from the device antenna 12 of the DUT 10 and is capable of transmitting radio waves to the device antenna 12.

The test antenna 641C in the present embodiment corresponds to an example of the "measurement antenna" in the present invention, the substrate 642C in the present embodiment corresponds to an example of the "support" in the present invention, and the pogo pin 645 in the present embodiment corresponds to an example of the "first connector" in the present invention.

As shown in the FIG. 8A, the test antenna 641C is provided inside the pusher 631C, that is, the test antenna 641C is surrounded by the pusher 631C. The test antenna 641C is movable relative to the socket 5 with the movement of the pusher 631C.

The distances between the test antenna 641C and the device antenna 12 when the pusher 631C contacts the DUT 10 are adjusted so that radio waves radiated from the device antenna 12 can reach the test antenna 641C with near-field. The test antenna 641C constitutes a patch antenna (microstrip antenna) composed of a plurality of radiating elements arranged in a matrix although not limited.

The substrate 642C has a shape on a flat plate, and the upper surface of the substrate 642C is fixed to the lower surface of the pusher 631C. A part of the substrate 642C is disposed inside the opening 6317 of the contact portion 6315, and the remaining part of the substrate 642C is disposed on the lower surface of the protruding portion 6316.

As shown in the FIG. 8A, the pogo pins 645 are provided outside the pusher 631C, and are connected to the test antenna 641C through wiring patterns (not shown) formed on the lower surface of the board 642C. As shown in FIG. 8B, the pogo pins 645 can contact pads 41 provided on the load board 4 with the pressing of the DUT 10 to the socket 5 by the drive unit 632. The test antenna 641C is electrically connected to the tester 3 via the pogo pins 645 and the pads 41 when the DUT 10 is being pressed against the socket 5 by the pusher 631C. This enables the test antenna 641C to transmit and receive electric signals to and from the tester 3.

The pads 41 in the present embodiment corresponds to an example of the "second connector" in the present invention.

The OTA test of the DUT 10 performed by the electronic component testing apparatus 1 according to the present embodiment will be described below. The process up to mounting the DUT 10 on the sockets 5 is the same as the OTA test in the first embodiment except eliminating the process relating to the anechoic chamber. As shown in the FIG. 8B, the following test for determining the characteristics of the radio wave radiation and the radio wave reception of the DUT 10 is performed with the DUT 10 being pressed against the sockets 5 by the pusher 631C.

Specifically, the test signal outputted from the main frame 31 is sent to the DUT 10 through the socket 5. The DUT 10 radiates radio waves upward from the device antenna 12. The radio waves are received by the test antennas 641C and converted into electrical signals. The electrical signals are sent to the main frame 31 via the pogo pins 645, the pads 41, and the test heads 32. The radio wave radiation characteristics of the DUT 10 are evaluated based using the signals.

Next, the test signals outputted from the main frame 31 are transmitted to the test antennas 641C through the pads 41 and the pogo pins 645 while keeping the DUT 10 pressed against the sockets 5. The test antenna 641C which has received the test signal radiates a radio wave downward. This radio wave is received by the device antenna 12 of the DUT 10 and is converted into an electric signal. The electric signal is sent to the main frame 31 via the socket 5. The radio wave reception characteristics of the DUT 10 is evaluated using the signal.

After evaluating DUT 10, the drive unit 632 raises the pusher 631 and the transport unit 62 moves the DUT 10 from the socket 5 to the holding plate 61. Then, the contact arm 21 of the handler 2 goes down and rises to raise the DUT 10 from the holding plate 61 with the DUT 10 held by the contact chuck 22.

As described above, in the present embodiment, the electronic component pressing apparatus 6C receives the DUT 10 from the handler 2 and moves the DUT 10 to the socket 5 connected to the tester 3. Using such electronic component pressing apparatus 6C allows to perform the radio wave radiation characteristic test of the DUT having an antenna on the upper surface of the device using the existing electronic component handling apparatus. This allows to reduce the cost of testing the DUT including an antenna.

Further, in the present embodiment, the test antenna 641C and the tester 3 can directly transmit and receive signals via the pogo pin 645 provided in the pusher unit 63C. This shortens the transmission distance between the test antenna 641C and the tester 3 and reduces the transmission loss, allows to improve the accuracy of the test of the device antenna 12 of the DUT 10.

In place of the pogo pins 645, coaxial connectors or waveguides may be used. For using the coaxial connector, for example, the upper coaxial connector is connected to the test antenna 641C via the wiring patterns. The upper coaxial connector is connected to the lower coaxial connector provided on the load board 4 in accordance with the pressing the DUT 10 to the sockets 5 by the drive unit 632 to connect the test antenna 641C to the tester 3.

For using the waveguide instead of the pogo pins 645, for example, an upper waveguide is connected to the upper coaxial connector via a coaxial waveguide converter adaptor. The upper waveguide is connected to the lower waveguide provided on the load board 4 in accordance with the pressing the DUT 10 to the sockets 5 by the drive unit 632 to connect the test antennas 641C to the tester 3. For connecting the test antenna 641C and the tester 3 using waveguides, the test antenna 641C and the tester 3 transmit and receive radio waves each other.

The Fourth Embodiment

Figure 9A:
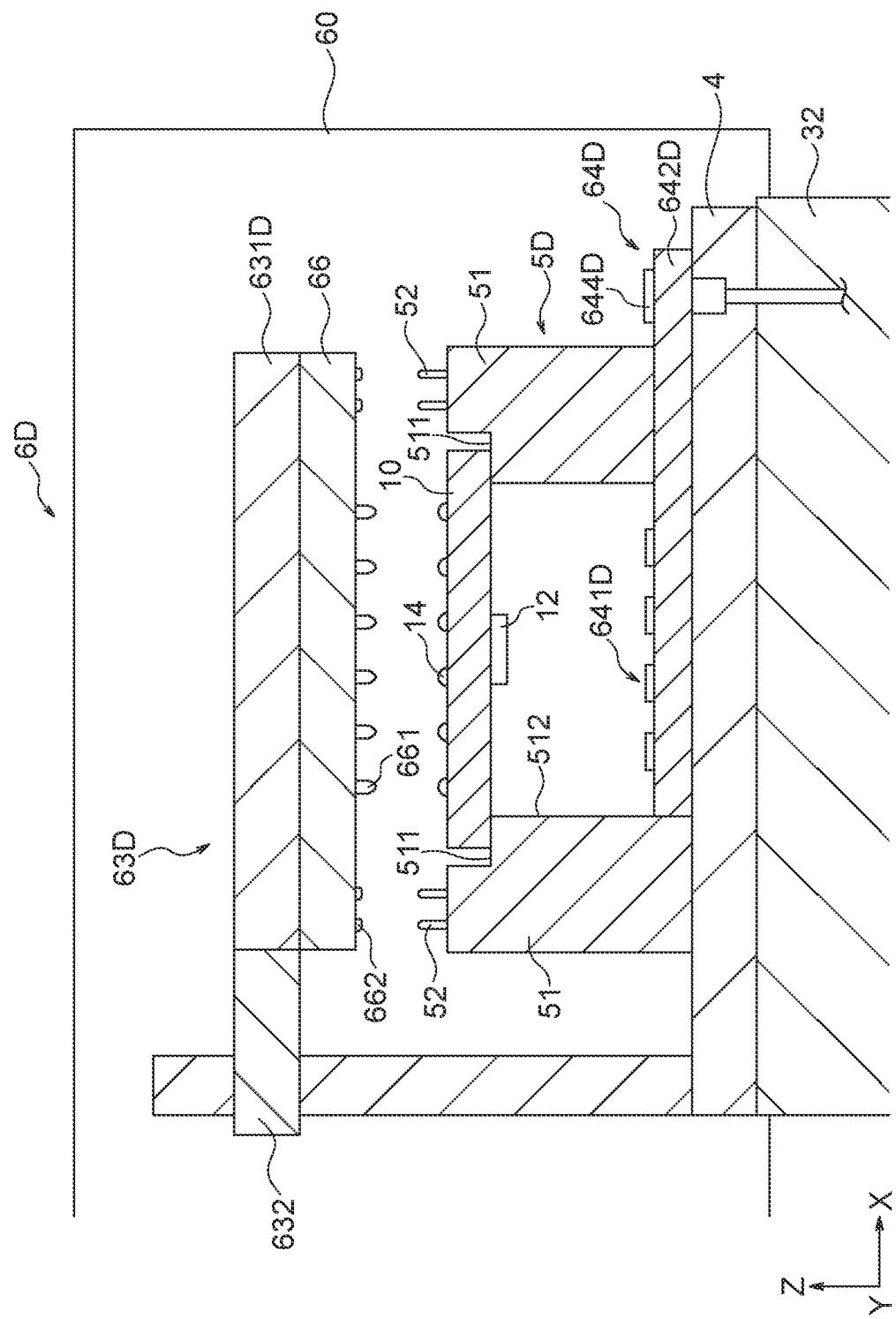
FIG. 9A is an enlarged view (part 1) corresponding to part II of FIG. 1 according to the fourth embodiment of the present invention.
Figure 9B:
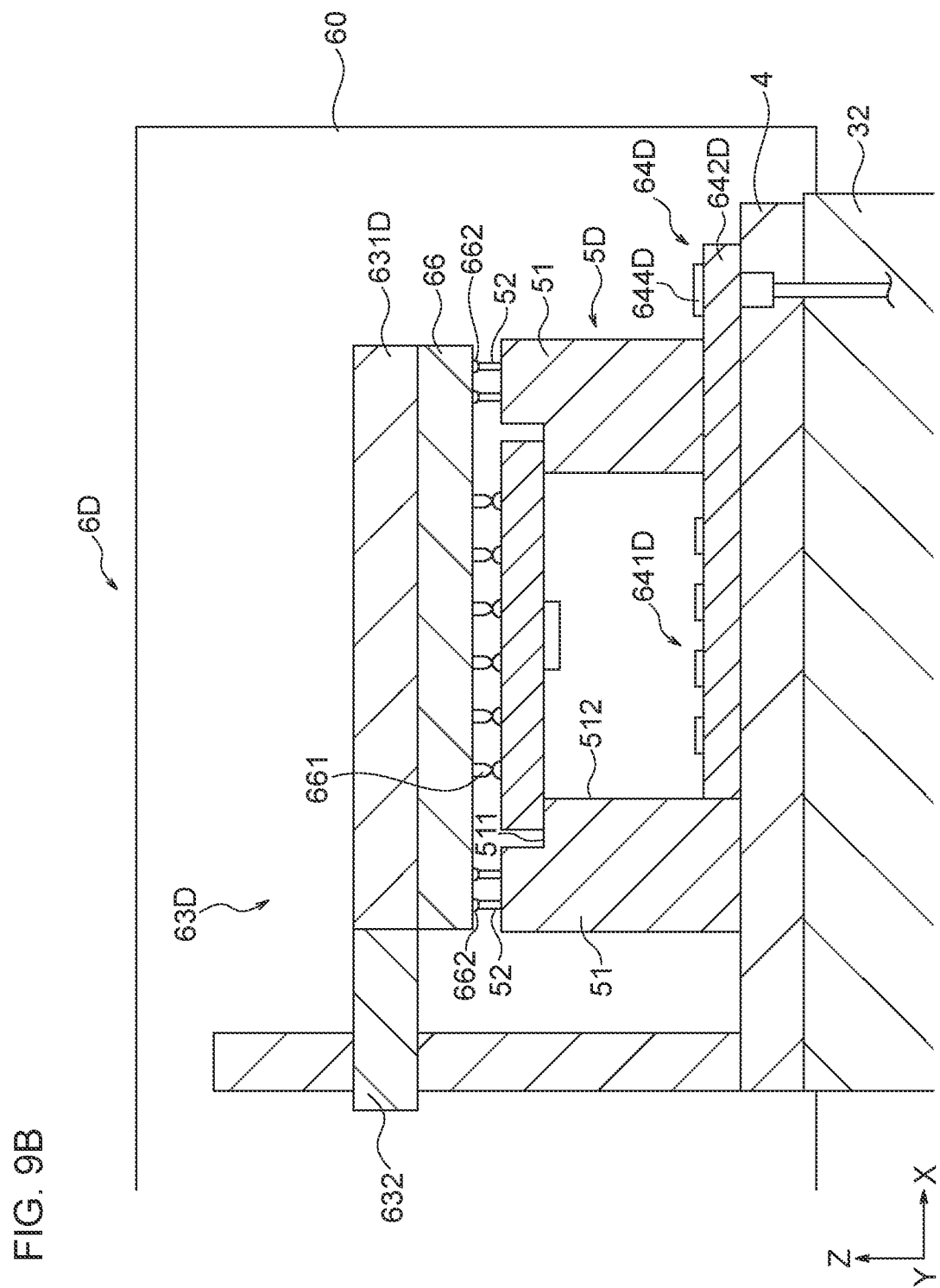
FIG. 9B is an enlarged view (part 2) corresponding to part II of FIG. 1 according to the fourth embodiment of the present invention.

FIG. 9A is an enlarged view (part 1) corresponding to Part II of FIG. 1 in the present embodiment, and FIG. 9B is an enlarged view (part 2) corresponding to Part II of FIG. 1 in the present embodiment.

The electronic component testing apparatus 1D in the present embodiment is different from the first embodiment in testing radio wave radiation characteristic of the DUT 10 in near-field, in not including an anechoic chamber, and in the structure of the pusher unit 63D, the antenna unit 64D, and, the socket 5D. Other configurations are the same as the first embodiment. Further, the electronic component testing apparatus 1D in the present embodiment is different from other embodiments, as shown in FIG. 9A, in that the DUT 10 is set on the socket 5D with the surface provided with the device antenna 12 facing downward. Hereinafter, the electronic component testing apparatus 1D according to the fourth embodiment will be described only with respect to the difference from the first embodiment, and the same reference numerals are assigned to the same components as those of the first embodiment, and descriptions thereof will be omitted.

As shown in the FIG. 9A, the electronic component testing apparatus 1D according to the present embodiment includes a top socket 66 mounted on the pusher 631D facing the socket 5D. The top socket 66 can be connected to the socket 5D in accordance with the pusher 631D pressing the DUT 10 against the socket 5D.

The top socket 66 includes pogo pins 661 and pads 662, and the pogo pins 661 and pads 662 are electrically connected via a conductive path provided in the top socket 66. The top socket 66 is fixed to the lower surface of the pusher 631D so that the pogo pin 661 protrudes downward. The pogo pins 661 are connected to the input-output terminal 14 of DUT 10 to connect electrically the DUT 10 to the electronic component testing apparatus 1D. The top socket 66 in the present embodiment corresponds to an example of the "second socket" in the present invention.

The pusher unit 63D in the present embodiment includes a pusher 631D and a drive unit 632. As shown in the FIG. 9A, the pusher 631D in the present embodiment is attached to the drive unit 632, and the pusher 631D lowered by the drive unit 632 causes the pads 662 of the top socket 66 to contact the pogo pins 52 (to be described later) included in the socket 5D.

The pusher 631D in the present embodiment corresponds to an example of the "pusher" in the present invention.

The sockets 5D include a base 51 and pogo pins 52. The socket 5D contacts the lower surface of the DUT 10 to hold the DUT 10 and is electrically connectable to the top socket 66.

The base 51 is fixed to the load board 4, for example, by screwing. The base 51 is made of an electrically insulating material such as a resin material, for example. The base 51 has a flat contact surface 511 on its upper portion and is capable of holding the DUT 10 in contact with the lower surface of the DUT 10 at the contact surface 511.

The base 51 has an opening 512 to allow the test antenna 641D (to be described later) to face the DUT 10 device antenna 12 with the top socket 66 contacting the socket 5D. Further, the base 51 has holding holes (not shown) penetrating the base 51 in thickness direction, and the pogo pins 52 are inserted into the holding holes, being held by the base 51.

The inner surface of the opening 512 may be covered with a radio wave absorber. As a material of the radio wave absorber, the same material as the radio wave absorber 652 of the anechoic chamber 65 can be used. This allows to eliminate the reflection of radio waves in the opening 512.

In addition, the radio wave absorber may be disposed inside the opening 512 so that the radio wave absorber is interposed between the measurement antenna 641D and the device antenna 12. This relatively shortens the actual distance between the test antenna 641D and the device antenna 12 while maintaining the distance on radio communication between the test antenna 641D and the device antenna 12. This allows to reduce the size of the socket 5D.

The pogo pins 52 are contactable contactors with pad 662s of the top socket 66. The lower end of the pogo pins 52 are in contact with the pads (not shown) of the load board 4 and is electrically connected to the pads. The upper end of the pogo pins 52 can touch the pads 662 of the top socket 66 by the top socket 66 contacting the socket 5D. The pogo pins 52 contacting the pads 662 causes the socket 5D to electrically connect to the top socket 66, allowing to transmit the test signal from the tester 3 to the top socket 66.

As shown in the FIG. 9A, the antenna unit 64D in the present embodiment includes a test antenna 641D, a substrate 642D, and a coaxial connector 644D. The test antenna 641D in the present embodiment corresponds to an example of the "measurement antenna" in the present invention.

The test antenna 641D, as shown in FIG. 9B, is disposed inside the opening 512 of the base 51 to face the device antenna 12 of the DUT 10 set on the contact surface 511. The distances between the test antenna 641D and the device antenna 12 are adjusted so that radio waves radiated from the device antenna 12 can reach the test antenna 641D in nearfield. The test antenna 641D includes, for example, a patch antenna (microstrip antenna) and a horn antenna.

The test antenna 641D is composed of a plurality of radiating elements arranged in a matrix on a substrate 642D although not limited. These radiating elements are connected to signal lines of a coaxial connector 644D mounted on the substrate 642D via a wiring pattern (not shown) formed on the substrate 642D.

In the OTA test of the DUT 10 in the present embodiment, the contact chuck 22 sucks and holds the side of the DUT 10 where the device antenna 12 is not disposed to set the DUT 10 on the socket 5D with the device antenna 12 facing the test antenna 641D disposed inside the socket 5D unlike the other embodiments. Thereafter, the test can be performed in the same manner as the OTA test in the first embodiment.

As described above, in the present embodiment, the electronic component pressing apparatus 6D receives the DUT 10 from the handler 2 and moves the DUT 10 to the socket 5 connected to the tester 3. Using such electronic component pressing apparatus 6 allows to perform the radio wave radiation characteristic test of the DUT having the antenna on the upper surface of the device using the existing electronic component handling apparatus. This allows to reduce the cost of testing the DUT including the antenna.

In the present embodiment, the testing apparatus 1D includes a test antenna 641D provided inside the socket 5D to face the device antenna 12 of the DUT 10. Contacting of the lower surface of the DUT 10 with the contact surface 511 of the socket 5D causes the device antenna 12 and the test antenna 641C to be positioned such that the radio waves from the device antenna 12 reaches the test antenna 641C in near-field.

Embodiments heretofore explained are described to facilitate understanding of the present invention and are not described to limit the present invention. It is therefore intended that the elements disclosed in the above embodiments include all design changes and equivalents to fall within the technical scope of the present invention.

Figure 10A:
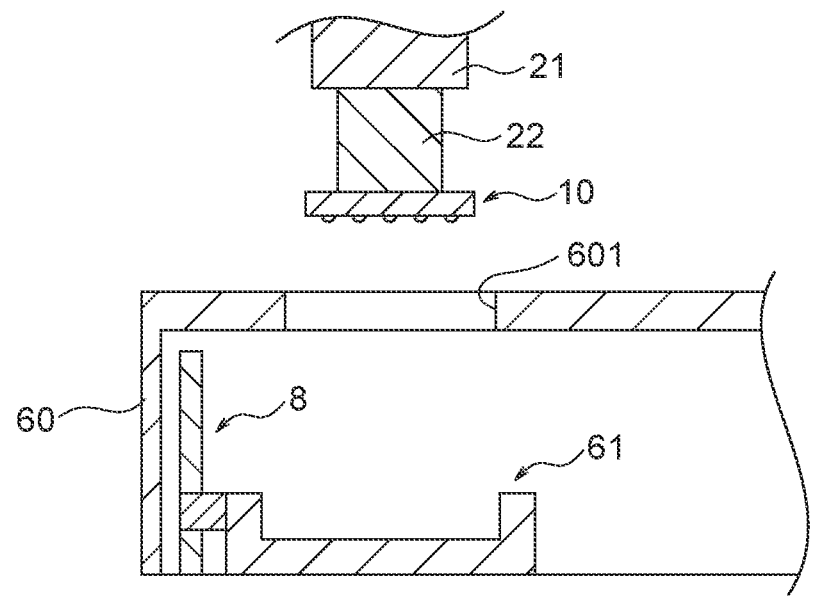
FIG. 10A is a cross-sectional view showing a modification of the holding plate in one or more embodiments of the present invention (part 1)
Figure 10B:
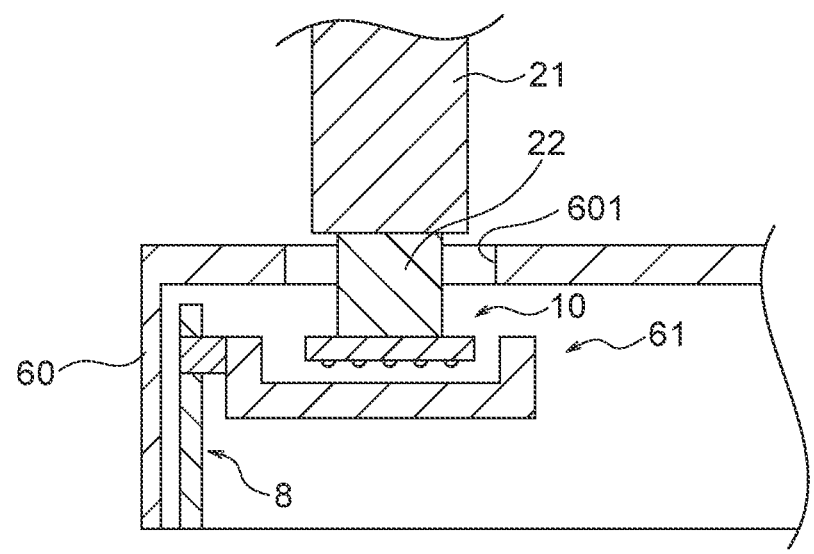
FIG. 10B is a cross-sectional view showing a modification of the holding plate in one or more embodiments of the present invention (part 2).

For example, as shown in FIG. 10A and FIG. 10B, the electronic component pressing apparatus 6 may include a lifting unit 8 for moving the holding plate 61 in the vertical direction. FIG. 10A is a cross-sectional view showing a modification of the holding plate in one or more embodiments of the present invention (part 1), and FIG. 10B is a cross-sectional view showing a modification of the holding plate of the present invention in one or more embodiments of the present invention (part 2). The lifting unit 8 in one or more embodiments of the present invention corresponds to an example of the "lifting unit" in the present invention.

The lifting unit 8, as shown in FIG. 10A and FIG. 10B, is disposed inside the electronic component pressing apparatus 6. The lifting unit 8 is configured by, for example, an electric cylinder, and is fixed to the chamber 60 to support the holding plate 61.

In this modification, as shown in FIG. 10B, the electronic component pressing apparatus 6 can receive the DUT 10 at the position closer to the opening 601 than without the lifting unit 8 from the contact chuck 22 by raising the holding plate 61 using the lifting unit 8. This allows the holding plate 61 to receive the DUT 10 from the contact chuck 22 if the vertically downward travel of the contact chuck 22 of the handler 2 is short.

Further, in another modification, as shown in FIG. 11A and FIG. 11B, the electronic component pressing apparatus 6 may include another transport unit 9 in addition to the transport unit 62. FIG. 11A is a diagram showing a modification of the transport unit in one or more embodiments of the present invention is an enlarged view corresponding to part III of FIG. 1, FIG. 11B is a plan view corresponding to FIG. 11A.

The transport unit 9 includes a holding portion 91, the vertical moving unit 92, the horizontal moving unit 93, and a guide rail 94. The holding unit 91, the vertical moving unit 92, and the horizontal moving unit 93, respectively, are configured similarly to the holding portion 621 of the transport unit 62, the vertical moving unit 622, and to the horizontal moving unit 623. The guide rail 94, on the side opposite to the guide rail 624 with respect to the holding plate 61 and the socket 5 in a plan view, are arranged to be parallel to the imaginary straight line connecting the holding plate 61 and the socket 5.

FIGS. 12A to 12I are cross-sectional views (1) to (9) illustrating an operation of testing an electronic component testing apparatus using a modification of a transport unit according to one or more embodiments of the present invention for testing the DUT.

The operation of the transport unit 62 and the transport unit 9 in the OTA test of the DUT 10 according to this modification will be described with reference to FIGS. 12A to 12I. In this modification, the transport unit 62 is a unit for moving the DUT 10 placed on the holding plate 61 by the contact chuck 22 to the socket 5. On the other hand, the transport unit 9 is a unit for moving the DUT 10 from the sockets 5 to the holding plate 61 after the DUT 10 radiation characteristics test.

Figure 12A:
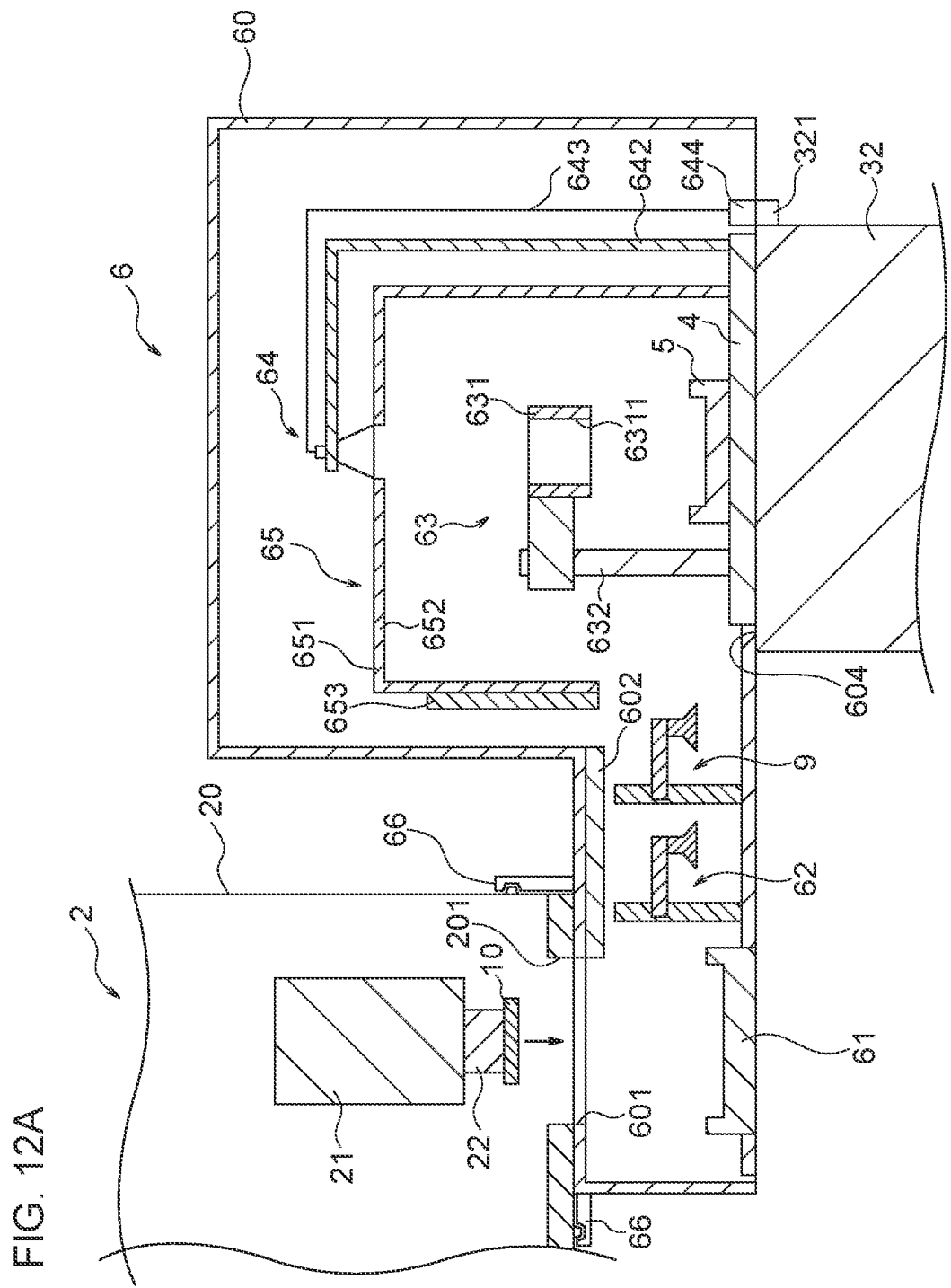
FIG. 12A is a cross-sectional view showing an operation of the electronic component testing apparatus using a modification of the transport unit in one or more embodiments of the present invention (part 1) for testing the DUT.
Figure 12B:
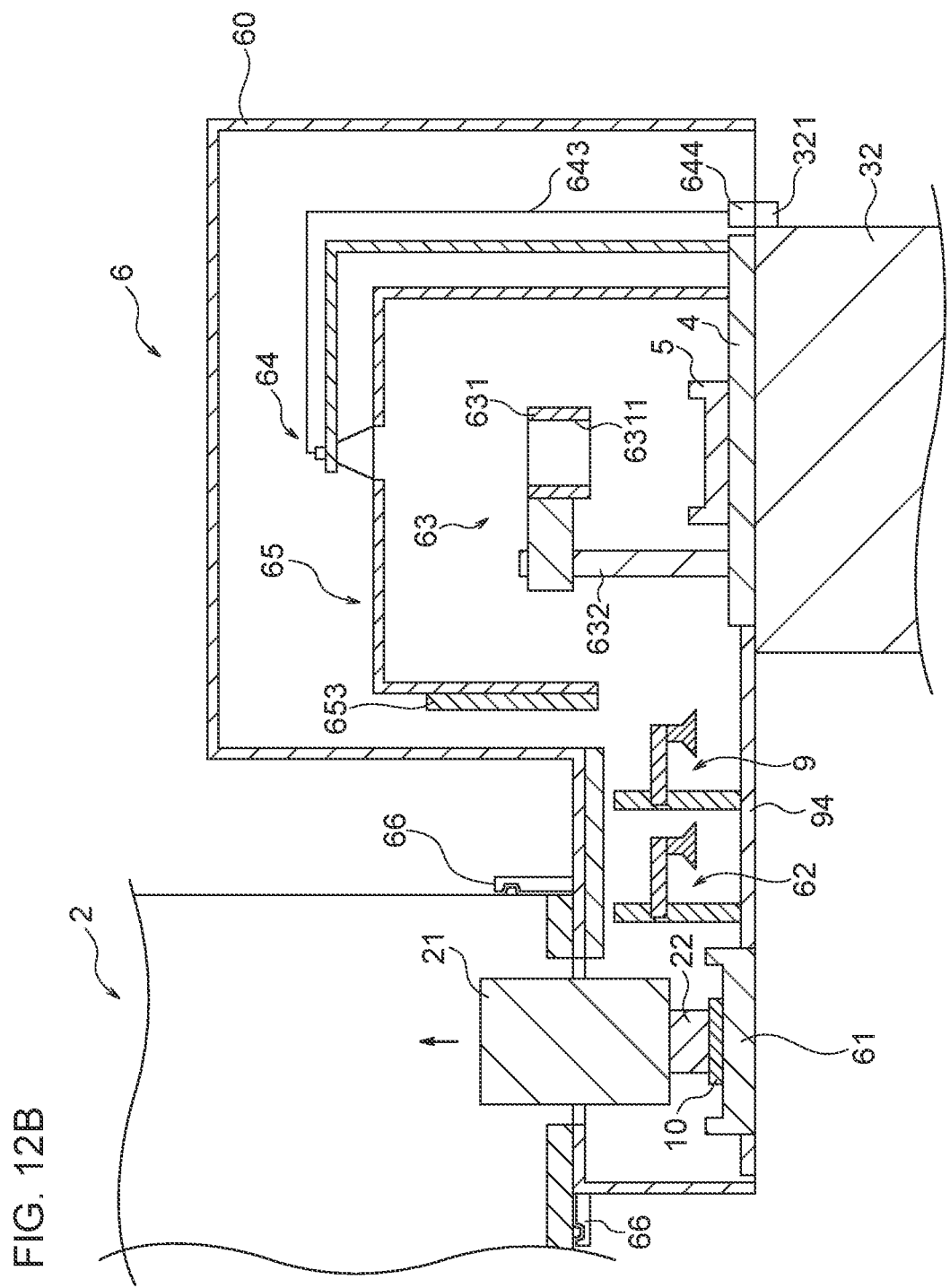
FIG. 12B is a cross-sectional view showing an operation of the electronic component testing apparatus using a modification of the transport unit in one or more embodiments of the present invention (part 2) for testing the DUT.

First, as shown in FIG. 12A, the DUT 10 is held by the contact chuck 22, and the DUT 10 is lowered by the contact arm 21 toward the holding plate 61, as shown in FIG. 12B.

The contact chuck 22 releases the DUT 10 when the DUT 10 contacting the holding plate 61.

Next, as shown in FIG. 12C, the contact chuck 22 is raised by the contact arm 21. Then, the transport unit 62 is moved to the holding plate 61, and DUT 10 is sucked and held by the suction pad 6211.

Figure 12D:
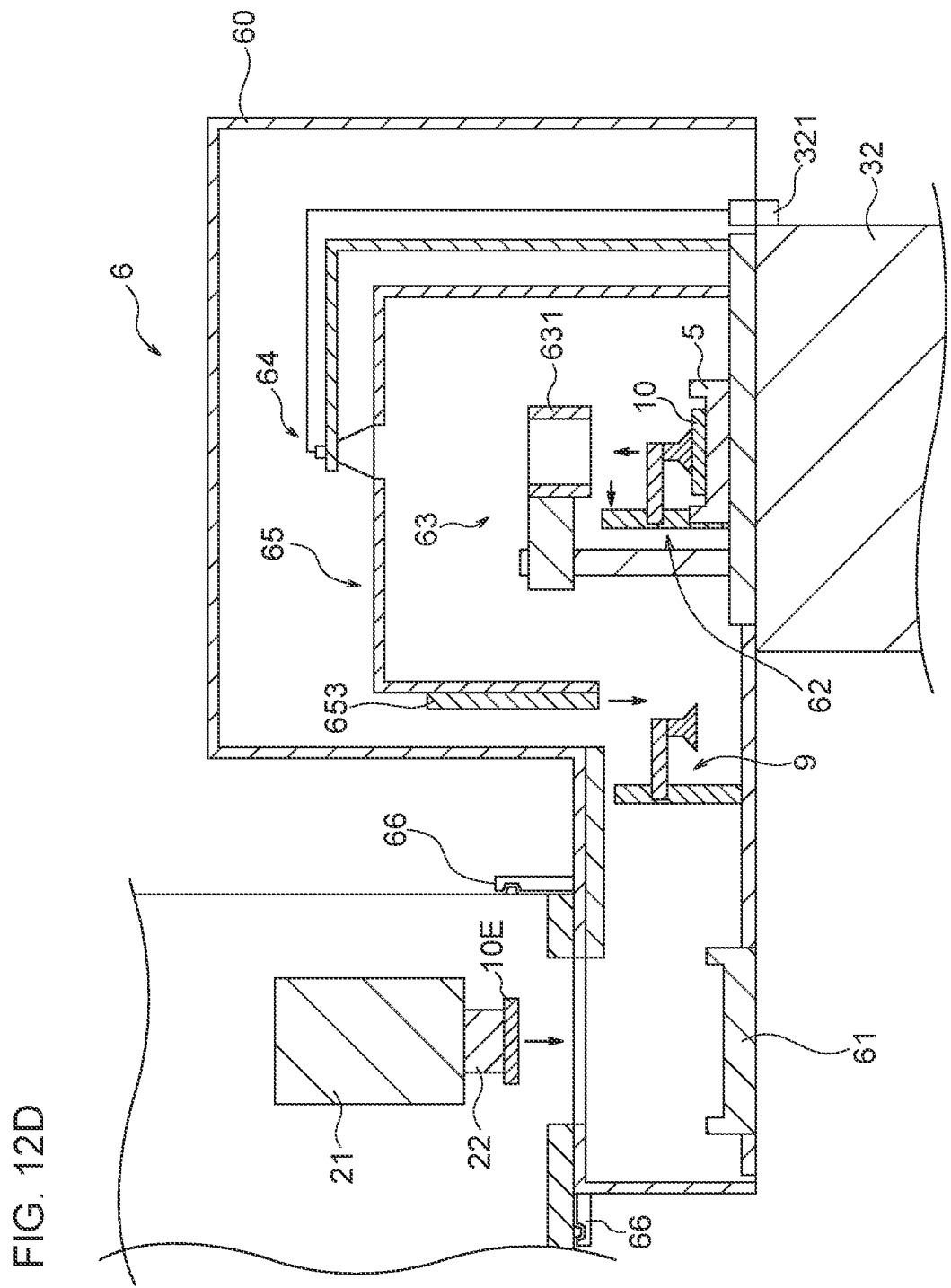
FIG. 12D is a cross-sectional view showing an operation of the electronic component testing apparatus using a modification of the transport unit in one or more embodiments of the present invention (part 4) for testing the DUT.

As shown in FIG. 12D, the transport unit 62 moves to directly above the socket 5 and is lowered to place the DUT 10 on the socket 5. The handler 2 holds the next DUT 10E to be tested by the contact chuck 22 and waits.

As shown in FIG. 12E, the transport unit 62 moves to the outside of the anechoic chamber 65 and the shutter 653 closes the opening 6512 of the shield box 651. Then, the pusher 631 is lowered to press the DUT 10 against the sockets 5, and the radio wave radiation characteristics test of the DUT 10 is performed.

At the same time, as shown in FIG. 12E, the contact chuck 22 is lowered by the contact arm 21, placing the DUT 10E on the holding plate 61.

Figure 12F:
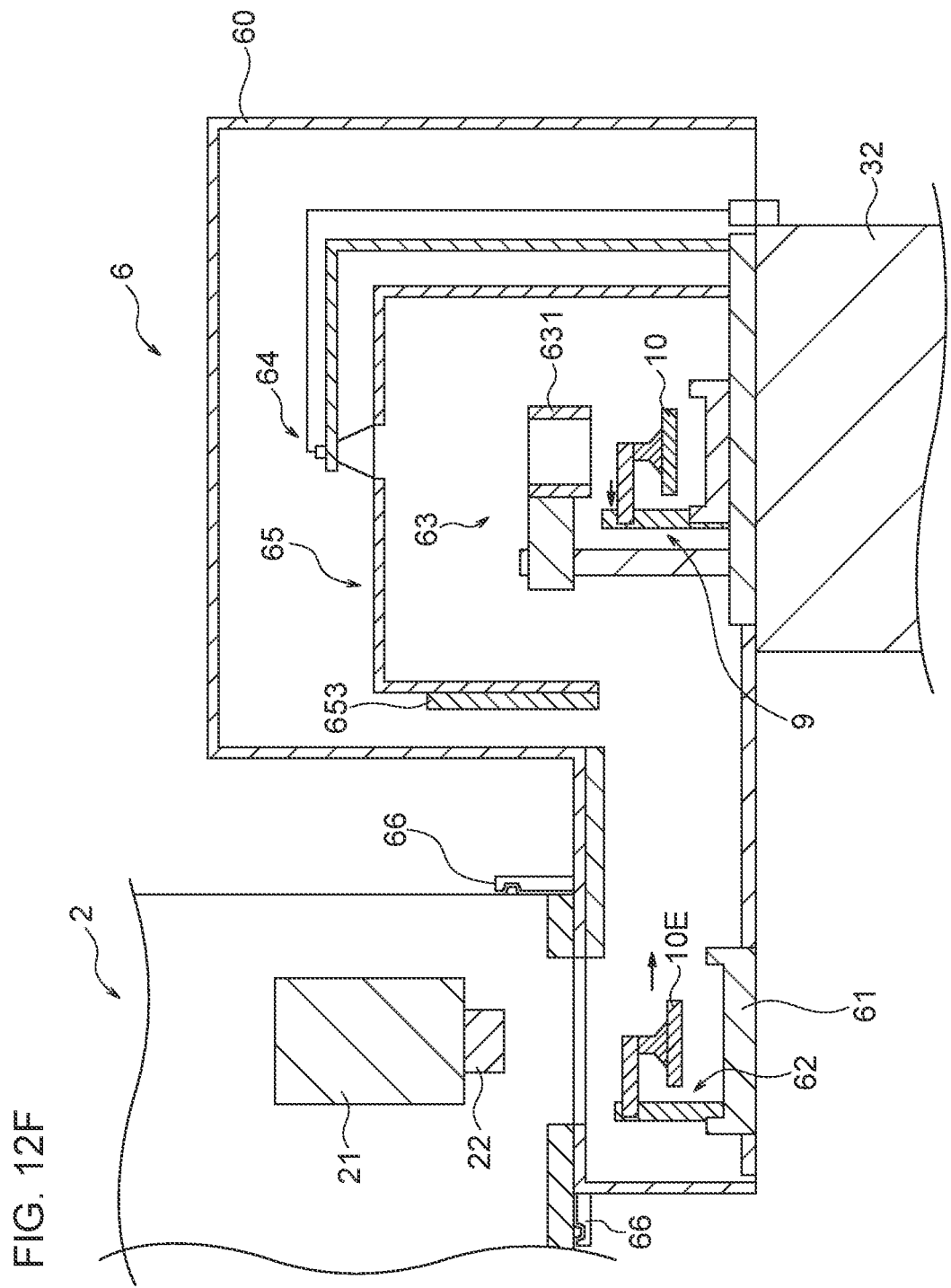
FIG. 12F is a cross-sectional view showing an operation of the electronic component testing apparatus using a modification of the transport unit in one or more embodiments of the present invention (part 6) for testing the DUT.

As shown in FIG. 12F, the shutter 653 of the anechoic chamber 65 is opened, and the transport unit 9 moves to the socket 5 to hold the DUT 10. In addition, the transport unit 62 moves to the holding plate 61 and holds the next DUT 10E to be tested.

Figure 12G:
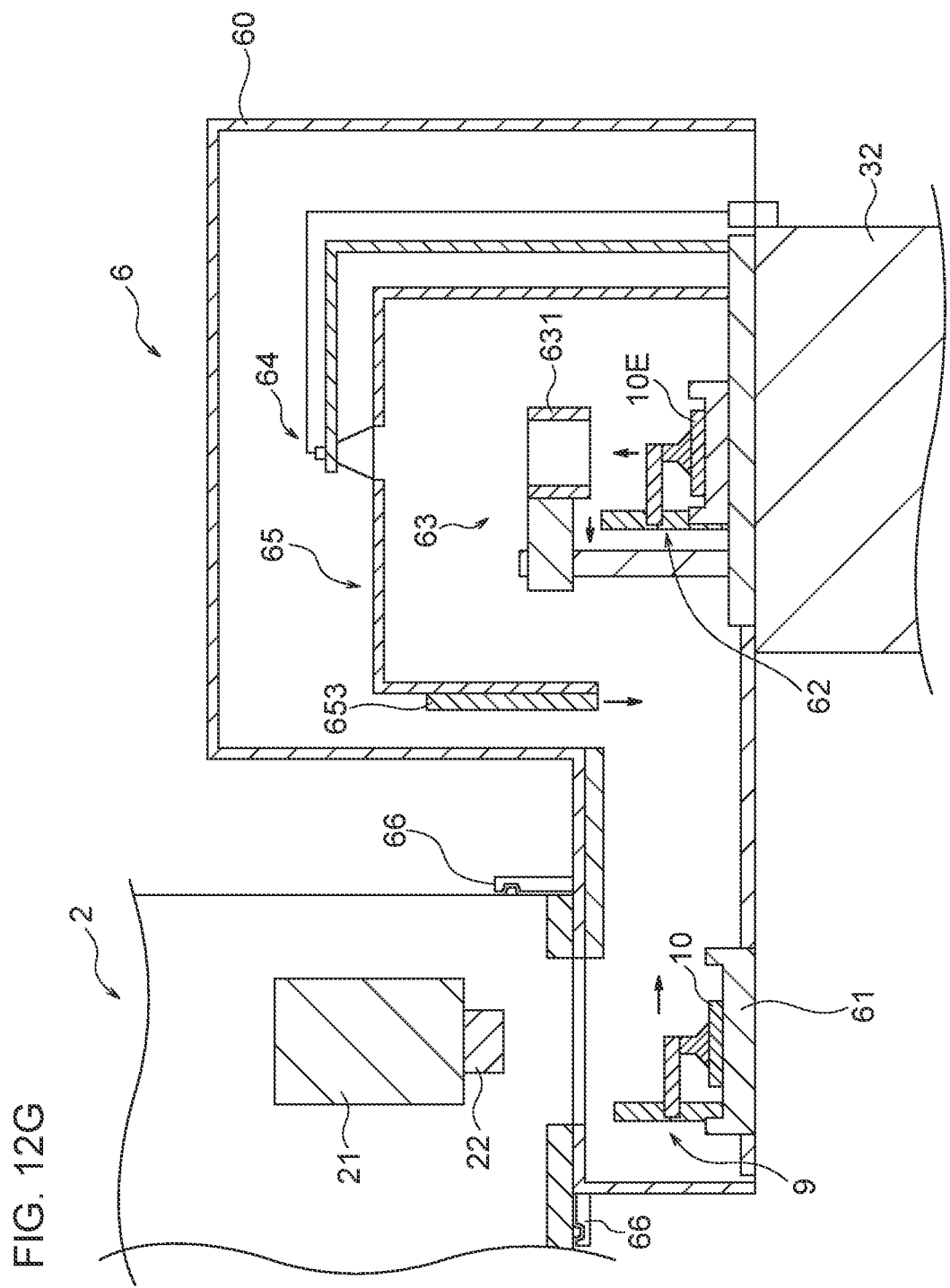
FIG. 12G is a cross-sectional view showing an operation of the electronic component testing apparatus using a modification of the transport unit in one or more embodiments of the present invention (part 7) for testing the DUT.

As shown in FIG. 12G, the transport unit 9 moves to place the DUT 10 on the holding plate 61. On the other hand, the transport unit 62 moves to place the DUT 10E on the sockets 5.

As shown in FIG. 12H, the transport unit 62 moves to the outside of the anechoic chamber 65 and the shutter 653 closes. The DUT 10E radio wave radiation characteristics test is performed while the pusher 631 is lowered and DUT 10E is pressed against the sockets 5. On the other hand, the DUT 10 placed on the holding plate 61 is held by the contact chuck 22 and raised by the contact arm 21.

Figure 12I:
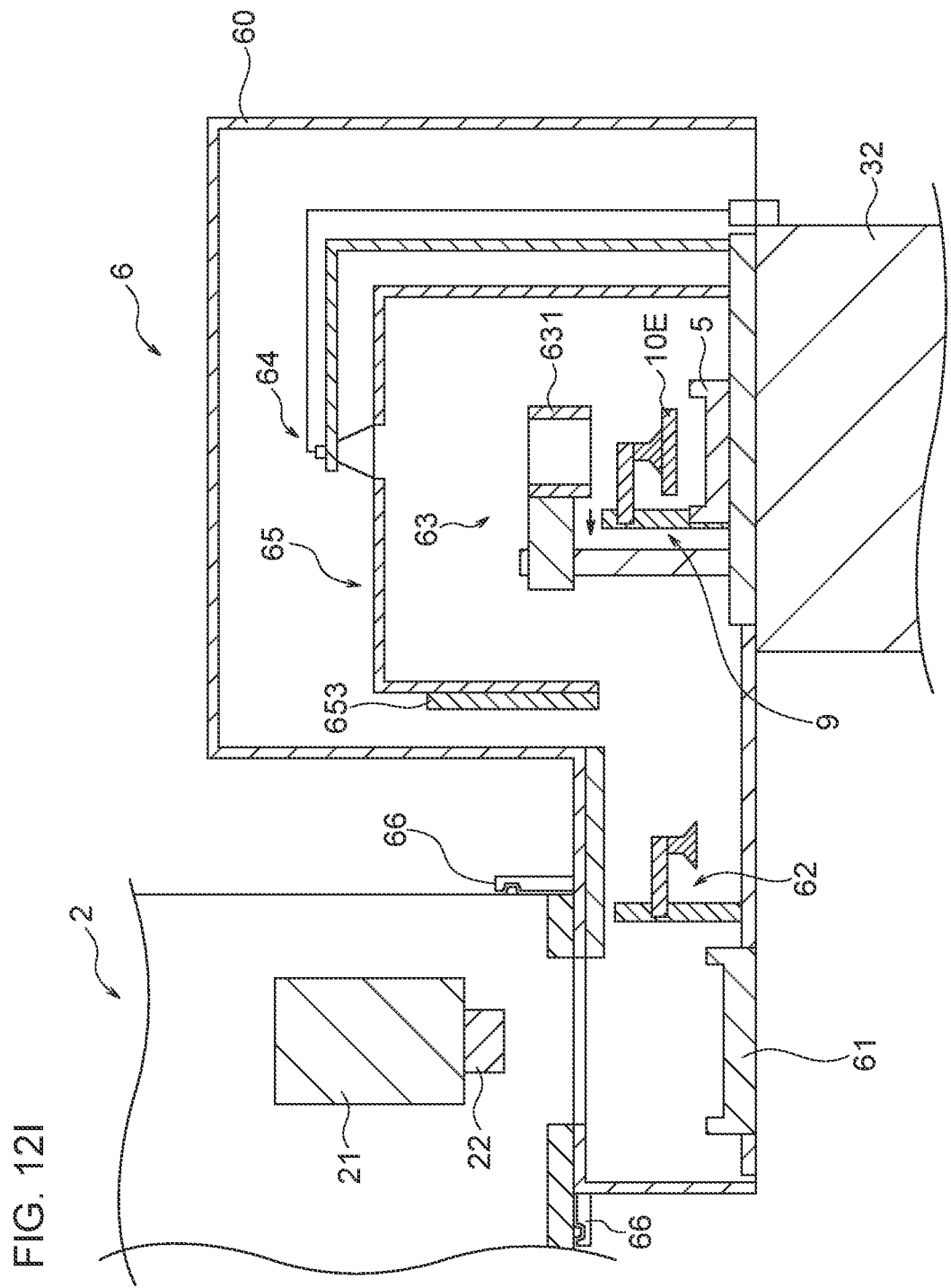
FIG. 12I is a cross-sectional view showing an operation of the electronic component testing apparatus using a modification of the transport unit in one or more embodiments of the present invention (part 9) for testing the DUT.

As shown in FIG. 12I, the transport unit 9 holds and moves the DUT 10E from the sockets 5 to the holding plate 61. The DUT 10E is held by the contact chuck 22 and raised by the contact arm 21.

In the electronic component testing apparatus 1 according to the present modification, with respect to one socket 5, moves the DUT using two transport units. This shortens the time from the end of the test of the DUT to the start of the test of the next DUT, as compared with the case where one transport unit is used, enhancing the efficiency of the OTA test of the DUT.

In one or more embodiments, the temperature condition of the DUT test is controlled using the thermostatic chamber 20 provided in the handler 2, but the method of temperature control is not particularly limited thereto. For example, a thermal block in contact with the DUT may be disposed immediately below the socket 5, and a refrigerant such as nitrogen may be flowed from the outside to the thermal block to perform temperature control.

Although the disclosure has been described with respect to only a limited number of embodiments, those skill in the art, having benefit of this disclosure, will appreciate that various other embodiments may be devised without departing from the scope of the present invention. Accordingly, the scope of the invention should be limited only by the attached claims.

REFERENCE SIGNS LIST 1, 1B,1C,1D, 1000 . . . Electronic component testing apparatus 2 . . . Handler 21 ... Contact arm
22 ... Contact chuck
3 ... Tester
31 ... Main frame
32 ... Test head
321 ... Connector
33 ... Cable
4 ... Load board
5, 5D Socket
51 ... Base
511 ... Contact surface
512 ... Opening
52 ... Pogo pins
6, 6B, 6C, 6D ... Electronic component pressing apparatus
60 ... Chamber
601 ... Opening
602 ... Shutter
604 ... Opening
61 ... Holding plate
611 ... Recess
62 ... Transport unit
621 ... Holding portion
6211 ... Suction pad
6212 ... Suction pipe
622 ... Vertical moving unit
623 ... Horizontal moving unit
624 ... Guide rail
63, 63B, 63C, 63D. Pusher unit
631, 631B, 631C, 631D. Pusher
6311 ... Opening
6312 ... Contact portion
6313 ... Opening
6314 ... Notch
6315 ... Contact portion
6316 ... Protruding portion
6317 ... Opening
632 ... Drive unit
64, 64B, 64C, 64D ... Antenna unit
641, 641B, 641C, 641D ... Test antenna
642, 642B ... Support
6421 ... Opening
642C, 642D ... Substrate
643, 643B. Communication line
644, 644B, 644D ... Connector
646 ... Pogo pins
66 ... Top socket
661 ... Pogo pins
662 ... Pads
65 ... Anechoic chamber
651 ... Shield box
6511 ... Opening
6512 ... Opening
652 ... Radio wave absorber
653 ... Shutter
8 ... Lifting unit
9 ... Transport unit
91 ... Holding portion
92 ... Vertical moving unit
93 ... Horizontal moving unit
94 ... Guide rail
10, 10E, 200 ... DUT

The invention claimed is:

1. An electronic component presser of an electronic component testing apparatus that is used to test a device under test (DUT) and that comprises an electronic component handler, an electronic component tester, and a first socket, wherein the electronic component presser connects to the electronic component handler and to the electronic component tester, the electronic component presser comprising:
a holding plate that holds the DUT that has been carried to the holding plate by a contact arm of the electronic component handler;
a transport unit that moves the DUT between the holding plate and the first socket;
a pusher that presses the DUT that has been disposed on the first socket;
an antenna unit comprising a measurement antenna that faces a device antenna of the DUT disposed on the first socket;
a first case that houses the holding plate, the transport unit, the pusher, and the antenna unit, wherein
the first case has:
a first opening through which the contact arm passes and that faces the holding plate; and
a second opening that faces the pusher, and
the first socket is disposed inside the first case at a position corresponding to the second opening.

2. The electronic component presser according to claim 1, further comprising:
a fixing member that fixes the first case to the electronic component handler having a third opening through which the contact arm passes, in a state where the third opening and the first opening face each other.

3. The electronic component presser according to claim 1, wherein
the first case comprises a shutter that closes the first opening.

4. The electronic component presser according to claim 1, further comprising:
a lifting unit that moves the holding plate in a vertical direction of the electronic component presser.

5. The electronic component presser according to claim 1, further comprising:
a drive unit that moves the pusher in a vertical direction of the electronic component presser.

6. An electronic component presser of an electronic component testing apparatus that is used to test a device under test (DUT) and that comprises an electronic component handler, an electronic component tester, and a first socket, wherein the electronic component presser connects to the electronic component handler and to the electronic component tester, the electronic component presser comprising:
a holding plate that holds the DUT that has been carried to the holding plate by a contact arm of the electronic component handler;
a transport unit that moves the DUT between the holding plate and the first socket;
a pusher that presses the DUT that has been disposed on the first socket; and
an antenna unit comprising a measurement antenna that faces a device antenna of the DUT disposed on the first socket, wherein
a relative positional relationship between the measurement antenna and the first socket is fixed,
the pusher has a fourth opening that faces the measurement antenna,
the measurement antenna faces the first socket through the fourth opening, and
the measurement antenna is on an opposite side of the pusher from the first socket.

7. The electronic component presser according to claim 6, further comprising:

a second case that houses the pusher; and
a radio wave absorber disposed on an inner wall of the second case, wherein
the first socket is disposed inside the second case.

8. An electronic component presser of an electronic component testing apparatus that is used to test a device under test (DUT) and that comprises an electronic component handler, an electronic component tester, and a first socket, wherein the electronic component presser connects to the electronic component handler and to the electronic component tester, the electronic component presser comprising:
　a holding plate that holds the DUT that has been carried to the holding plate by a contact arm of the electronic component handler;
　a transport unit that moves the DUT between the holding plate and the first socket;
　a pusher that presses the DUT that has been disposed on the first socket; and
　an antenna unit comprising a measurement antenna that faces a device antenna of the DUT disposed on the first socket, wherein
　a relative positional relationship between the measurement antenna and the first socket is fixed,
　the pusher comprises a contact portion that contacts the DUT on the first socket,
　the antenna unit further comprises:
　　a support that supports the measurement antenna; and
　　a first connector connected to the measurement antenna to transmit a radio wave or an electrical signal,
　the contact portion has:
　　a fifth opening that faces the first socket; and
　　a cut through which the support penetrates a side of the contact portion,
　the measurement antenna is disposed in the fourth opening while the contact portion contacts the DUT, and
　the first connector connects to a second connector connected to a test head of the electronic component tester.

9. An electronic component presser of an electronic component testing apparatus that is used to test a device under test (DUT) and that comprises an electronic component handler, an electronic component tester, and a first socket, wherein the electronic component presser connects to the electronic component handler and to the electronic component tester, the electronic component presser comprising:
　a holding plate that holds the DUT that has been carried to the holding plate by a contact arm of the electronic component handler;
　a transport unit that moves the DUT between the holding plate and the first socket;
　a pusher that presses the DUT that has been disposed on the first socket; and
　an antenna unit comprising a measurement antenna that faces a device antenna of the DUT disposed on the first socket, wherein
　the pusher has a sixth opening that faces the first socket,
　the measurement antenna is disposed inside the pusher to face the first socket through the sixth opening,
　the measurement antenna moves relative to the first socket with movement of the pusher,
　the antenna unit further comprises:
　　a support that supports the measurement antenna; and
　　a first connector connected to the measurement antenna to transmit a radio wave or an electrical signal, and
　the first connector connects to a second connector connected to a test head of the electronic component tester when the DUT is pressed against the first socket by the pusher.

10. An electronic component testing apparatus for testing a device under test (DUT), the electronic component testing apparatus comprising:
　an electronic component handler comprising a contact arm;
　a first socket;
　an electronic component tester comprising a test head on which the first socket is disposed; and
　an electronic component presser comprising:
　　a holding plate that holds the DUT that has been carried to the holding plate by the contact arm;
　　a transport unit that moves the DUT between the holding plate and the first socket;
　　a pusher that presses the DUT that has been disposed on the first socket;
　　an antenna unit comprising a measurement antenna that faces a device antenna of the DUT disposed on the first socket; and
　　a first case that houses the holding plate, the transport unit, the pusher, and the antenna unit, wherein
　　the first case has:
　　　a first opening through which the contact arm passes and that faces the holding plate; and
　　　a second opening that faces the pusher, and
　　the first socket is disposed inside the first case at a position corresponding to the second opening, wherein
　the electronic component tester tests the DUT by transmitting and receiving radio waves between the device antenna and the measurement antenna while the DUT is electrically connected to the first socket and the measurement antenna is electrically connected to the electronic component tester.

11. An electronic component testing apparatus for testing a device under test (DUT), the electronic component testing apparatus comprising:
　an electronic component handler comprising a contact arm;
　a first socket;
　an electronic component tester comprising a test head on which the first socket is disposed; and
　an electronic component presser comprising:
　　a holding plate that holds the DUT that has been carried to the holding plate by the contact arm;
　　a transport unit that moves the DUT between the holding plate and the first socket;
　　a pusher that presses the DUT that has been disposed on the first socket; and
　　an antenna unit comprising a measurement antenna that faces a device antenna of the DUT disposed on the first socket, wherein
　the measurement antenna is electrically connected to the electronic component tester,
　the measurement antenna is disposed inside the first socket to face the device antenna of the DUT disposed on the first socket,
　the electronic component testing apparatus further comprises a second socket disposed on a side of the pusher, the side facing the first socket,
　the second socket is connected to the first socket when the DUT is pressed against the first socket by the pusher, and the electronic component tester tests the DUT by transmitting and receiving radio waves between the device antenna and the measurement antenna while the DUT and the second socket are electrically connected to each other and the second socket is electrically connected to the test head via the first socket.

\* \* \* \* \*